(12) United States Patent
Gössel et al.

(10) Patent No.: US 8,219,864 B2
(45) Date of Patent: Jul. 10, 2012

(54) CIRCUIT ARRANGEMENT

(75) Inventors: Michael Gössel, Mahlow (DE); Egor Sogomonyan, Moskau (RU); Daniel Marienfeld, Potsdam (DE)

(73) Assignee: Universitaet Potsdam, Potsdam (DE)

( * ) Notice: Subject to any disclaimer, the term of this patent is extended or adjusted under 35 U.S.C. 154(b) by 729 days.

(21) Appl. No.: 12/304,729

(22) PCT Filed: May 18, 2007

(86) PCT No.: PCT/DE2007/000900
§ 371 (c)(1),
(2), (4) Date: Apr. 23, 2009

(87) PCT Pub. No.: WO2007/143964
PCT Pub. Date: Dec. 21, 2007

(65) Prior Publication Data
US 2010/0070811 A1 Mar. 18, 2010

(30) Foreign Application Priority Data

Jun. 12, 2006 (DE) .......................... 10 2006 027 448

(51) Int. Cl.
*G06F 11/10* (2006.01)
(52) U.S. Cl. ........................................ 714/746
(58) Field of Classification Search .............. 714/746
See application file for complete search history.

(56) References Cited

U.S. PATENT DOCUMENTS

| | | | |
|---|---|---|---|
| 3,699,323 A | 10/1972 | Reinheimer | |
| 4,924,423 A | 5/1990 | Vassiliadis et al. | |
| 4,964,126 A * | 10/1990 | Musicus et al. | 714/797 |
| 5,450,340 A | 9/1995 | Nicolaidis | |
| 2004/0255204 A1 | 12/2004 | Nicolaidis | |
| 2006/0015786 A1 * | 1/2006 | Mitra et al. | 714/724 |

(Continued)

OTHER PUBLICATIONS

Gossel, Michael, Error Detection Circuits, McGraw-Hill Book Company 1994, 8 pages.

(Continued)

*Primary Examiner* — Bryce Bonzo
(74) *Attorney, Agent, or Firm* — Schmeiser, Olsen & Watts, LLP

(57) ABSTRACT

The invention relates to a circuit arrangement, comprising: a functional circuit with m (m=1, 2, . . . ) data inputs and n (n=1, 2, . . . ) data outputs for processing at least one m-dimensional binary data input (x1, . . . , xm) to form an n-dimensional data output (y1, . . . , yn), wherein the functional circuit comprises at least one combinatorial circuit part, at least two registers with a word length k (k=1, 2, . . . ; k≦n) which are coupled to at least some of the n data outputs of the functional circuit in order to store output values (y=y1, . . . , yk; y'=y'1, . . . , y'k) which are duplicated with respect to one another or are duplicated with bit-by-bit inversion with respect to one another, said output values being derived from the n-dimensional data output (y1, . . . , yn) of the functional circuit, at least one corrector with an input word length 2k and an output word length k, which is coupled to data outputs of the at least two registers and supplies a k-dimensional corrected data output (y[k](korr)=y1(korr), . . . , yk(korr)), and an error detection circuit for detecting errors during operation of at least one of the aforementioned circuit elements: the functional circuit, the at least two registers and the corrector.

25 Claims, 13 Drawing Sheets

U.S. PATENT DOCUMENTS

2006/0067531 A1    3/2006  Yamazaki et al.
2007/0016823 A1*   1/2007  Jang et al. .................. 714/6

OTHER PUBLICATIONS

Rao, T.R.N., Error-Control Coding for Computer Systems, Prentice Hall, 1989, 3 pages.
Lala, Parag K., Self-Checking and Fault-Tolerant Digital Design, Morgan Kaufmann Publishers, 2001, 5 pages.
Liden, Peter et al., On Latching Probability of Particle Induced Transients in Combinational Networks, 1994 IEEE, pp. 340-349.
Buchner, S. et al., Comparison of Error Rates in Combinational and Sequential Logice, 1997 IEEE, pp. 2209-2216.
Muller, David E. et al., A Theory of Asynchronous Circuits, Proc. Int. Symp. on the Theory of Switching, 3 pages, Published 1959.
Shams, Maitham et al., Optimizing CMOS Implementations of the C-element, Proceedings ICCD 1997, 6 pages.
Shams, Maitham et al., Modeling and Comparing CMOS Implementations of the C-Element, 1998 IEEE, pp. 563-567.
Kundu, S. et al., Self-Checking Comparator with One Periodic Output, IEEE Trans. Comp. vol. 45 Mar. 1996, pp. 379-380.
Mitra, Subhasish et al., Logic Soft Errors a Major Barrier to Robust Platform Design, 2005 IEEE, pp. 1-10.

* cited by examiner

Table of values for the C-element Ci

| yvi | yi | yi' | y(korr)i |
|-----|-----|-----|----------|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Fig.4

Evaluation logic

| P1 | P2 | P3 | u1 | u2 | Comment |
|----|----|----|----|----|---------|
| 0 | 0 | 0 | 0 | 0 | no errors |
| 0 | 0 | 1 | 1 | 1 | incorrectly corrected |
| 0 | 1 | 0 | 1 | 0 | P2 incorrect |
| 0 | 1 | 1 | 0 | 1 | P1 incorrect |
| 1 | 0 | 0 | 0 | 1 | P1 incorrect |
| 1 | 0 | 1 | 1 | 0 | P2 incorrect |
| 1 | 1 | 0 | 1 | 1 | incorrectly corrected |
| 1 | 1 | 1 | 0 | 0 | no errors |

Fig.11

CIRCUIT ARRANGEMENT

The invention relates to the field of error detection and error correction in digital circuits.

BACKGROUND OF THE INVENTION

Due to the high degree of integration of electronic circuits, the frequency of errors is increasing. It is known to monitor digital circuits for example by duplication and comparison, by using codes and generally by means of error detection circuits (cf. Goessel et al. "Error Detecting Circuits", McGrawHill, 1994; Rao et al. "Error Control Coding for Computer Systems", Prentice Hall, 1989).

An error detection circuit is used to detect an error in the circuit to be monitored. If errors occur relatively frequently in electronic circuits, then it is particularly disadvantageous that the errors cannot be corrected by the error detection circuit, and therefore the circuit is relatively often not capable of functioning due to its errors.

It is also known to use error-correcting circuits to correct the errors which occur. For instance, it is known to design error-correcting circuits through system triplication and one or more subsequent voters and on the basis of error-correcting codes (cf. Lala, P. K., "Self-Checking and Fault-Tolerant Digital Design", Morgan Kaufman Publishers, San Francisco, 2001). One particular disadvantage here is the fact that the necessary hardware complexity is high and that only relatively few errors can be corrected when using an error-correcting code.

Due to the high degree of integration of electronic circuits, the susceptibility to errors and the frequency of errors is increasing with regard to non-permanent or transient errors. These errors may lead to "soft errors" in the memory elements.

Electronic digital circuits generally consist of a combinatorial circuit part and memory elements which can be formed as latches or as flip-flops. If a transient error occurs in the combinatorial circuit part, then logical, electrical and temporal conditions have to be met simultaneously (cf. Liden et al. "On Latching Probability of Particle Induced Transients in Combinational Networks", Proc. Int. Symp. On Fault-Tolerant Computing, pages 340-349, 1994) so that such an error can act as a soft error in a memory element.

More frequently, a soft error occurs in a memory element directly, wherein the memory element may be a latch or a flip-flop, such an error being caused for example by radiation. The occurrence of soft errors in latches or flip-flops is known and is described for example in Buchner et al. "Comparison of Error Rates in Combinational and Sequential Logic", IEEE Trans. Nucl. Science. vol. 44, pages 2209-2216, 1997. It is known that the sensitivity of a latch or flip-flop with regard to the occurrence of a soft error depends on the value of the clock signal clock. If, for example, clock=1, then the data input of the latch or flip-flop determines the state of the memory element and the memory element is immune to soft errors. If clock=0, then the state of the memory element is decoupled from the data input and the state of the latch or flip-flop is sensitive to soft errors. If in a memory element, therefore, a soft error occurs which has been produced in the memory element for example by radiation, then the state of the memory element is correct for the value clock=1 of the clock signal and is incorrect for the value clock=0 of the clock signal.

In one clock cycle, the clock signal changes from 1 to 0. The state for a soft error caused in the memory element is therefore correct in the first half of the cycle and incorrect in the second half of the cycle. If, on the other hand, a transient error exists in the combinatorial circuit part and the logical, electrical and temporal conditions are met, then the incorrect data input at the input of a memory element is accepted by the memory element and the state of the memory element is incorrect for the entire cycle.

C-elements are known in various embodiments and implementations (cf Muller et al., "A Theory of Asynchronous Circuits", Proc. Int. Symp. on the Theory of Switching, pages 2004-43, Harvard Univ. Press, 1959; Shams et al. "Optimizing CMOS Implementations of the C-element", Proc. ICCD 97, pages 700-705, 1997; "Modeling and Comparison CMOS Implementations of the C-Element, Trans. VLSI-Systems, vol. 6, pages 563-567, 1998). In order to improve the electrical properties of C-elements, for example in order to avoid quiescent currents, in particular the output of the C-element can be designed differently. Since the design of different C-elements is known per se to the person skilled in the art, it is not necessary to discuss this in any further detail here.

The C-element usually has two inputs and one output. If the two input values are the same, it outputs its input value. If its two input values are not the same, it outputs the previous value. A C-element with a plurality of inputs has been used for error detection (cf. Kundu et al. "Self-Checking Komparator with One Periodic Eingang, IEEE Trans. Comp. vol. 45, pages 379-380, 1996). The C-element can therefore be used to correct soft errors which have been produced in the memory elements if the memory elements are duplicated. The inputs of a C-element with two inputs are connected in this case to the two outputs of duplicate memory elements. If the outputs of the duplicate memory elements are the same, the same output value is output at the output of the C-element. If the two outputs of the two memory elements are different, the C-element outputs the previous value.

If a soft error is caused in one of the two memory elements for example by radiation, then the state of said one memory element changes only for the value clock=0 of the clock signal. The outputs of the two memory elements then correspond for the value clock=1 of the clock signal, whereas they differ for the value clock=0 of the clock signal. At the output of the C-element, the value applied to the input of the memory elements at the time at which the clock signal is 1 is output, and the present soft error caused in one of the memory elements for example by radiation is corrected.

In Mitra et al. ("Logic Soft-Errors a Major Barrier to Robust Platform Design", Proc. ITC 2005, paper 28.5), circuits are considered which have special redundancy for the functional test, for the scan test and for debugging and which are operated in various modes. Special memory elements, so-called scan-out flip-flops, are used for building the circuits. For such circuits, the detection of soft errors, which have been caused exclusively in latches of these special memory elements, and the correction of soft errors, which have likewise been caused in latches of these special memory elements, is described by the XOR linking of the outputs of two latches of these memory elements and by the addition of a C-element.

It can be seen that the memory elements known as "scan-out flip-flops" are relatively complicated. They are operated in various modes which are selected via control lines and special control signals, which is complicated. For error detection, the solution proposed by Mitra et al. allows only the comparison or the XOR linking of the outputs of duplicate latches of the memory elements, wherein a certain mode has to be selected via a control line by a control signal. It can also be seen that only the errors which have been produced directly in a latch of a memory element, which is a "scan-out flip-flop", can be detected in the described manner through the comparison or XOR linking of the outputs of duplicate latches of these memory elements. It is disadvantageous that errors in the combinatorial circuit parts of the circuit cannot be detected, since errors in the combinatorial circuit always lead to identical values in the duplicate latches of the memory elements. Errors in the corrected values further processed or output by the circuit and in the C-elements used also cannot be detected, so that the correctness of the corrected values cannot be checked, which is also disadvantageous.

A method for optimizing the transmission of data packets over a transmission channel is known from the document US 2006/0067531 A1. In particular, the document deals with the efficient transmission of the header of data packets. A method is proposed in which, between a transmitting device and a receiving device, a data packet is encrypted by means of a code selected from a plurality of encryption codes.

SUMMARY OF THE INVENTION

The object of the invention is to create a circuit arrangement which is as simple as possible, with a functional circuit which comprises at least one combinatorial circuit part, and also with error correction and error detection, in which soft errors in registers can be corrected and also errors during operation in the at least one combinatorial circuit part, the registers and corrected output values can be detected in the best possible manner.

This object is achieved according to the invention by a circuit arrangement according to independent claim 1. Advantageous embodiments of the invention form the subject matter of dependent claims.

According to the invention, there is provided a circuit arrangement having the following features:

- a functional circuit with m (m=1, 2, . . . ) data inputs and n (n=1, 2, . . . ) data outputs for processing at least one m-dimensional binary data input (x1, . . . , xm) to form an n-dimensional data output (y1, . . . , yn), wherein the functional circuit comprises at least one combinatorial circuit part,
- at least two registers with a word length k (k=1, 2, . . . ; k≦n) which are coupled to at least some of the n data outputs of the functional circuit in order to store output values (y=y1, . . . , yk; y'=y'1, . . . , y'k) which are duplicated with respect to one another or are duplicated with bit-by-bit inversion with respect to one another, said output values being derived from the n-dimensional data output (y1, . . . , yn) of the functional circuit,
- at least one corrector with an input word length 2k and an output word length k, which is coupled to data outputs of the at least two registers and supplies a k-dimensional corrected data output (y[k](korr)=y1(korr), . . . , yk(korr)), and
- an error detection circuit for detecting errors during operation of at least one of the aforementioned circuit elements: the functional circuit, the at least two registers and the corrector.

The circuit arrangement makes it possible to omit the need for special controllable memory elements with different modes of operation. In particular, it is also not necessary for there to be a special scan mode or a mode for debugging. The complexity of error detection can be adapted to the required certainty of error detection, for example by using different error-detecting codes.

Since the circuit arrangement contains an error detection circuit for combinatorial circuit parts and registers, it is also possible to detect transient errors and permanent errors in combinatorial circuit parts, registers and the corrector which cannot be corrected by C-elements. Advantageously, the corrected outputs of the corrector are also integrated in the error detection circuit, so that incorrectly corrected values, for example due to errors in a C-element, can be detected as incorrect.

Since different codes can be used for implementing the error detection circuit, the complexity of error detection can advantageously be adapted to the required certainty of error detection.

One preferred further development of the invention provides that the corrector is formed using at least one C-element.

In one advantageous embodiment of the invention, it may be provided that the error detection circuit is configured to include at least one component of the k-dimensional corrected data output (y[k](korr)) in the error detection during operation.

One advantageous embodiment of the invention provides that, for i=1, . . . , k, an $i^{th}$ data output of one of the at least two registers is passed to a $(2i-1)^{th}$ data input of the corrector and an data output of another of the at least two registers is passed to a $2i^{th}$ data input of the corrector.

One preferred further development of the invention provides that the corrector is formed using a parallel connection of k C-elements (C1 21, . . . , Ck 2k).

One preferred further development of the invention provides that, in the case of the parallel connection of the k C-elements (C1 21, . . . , Ck 2k), a $1^{st}$ and a $2^{nd}$ data input, . . . , a $(2k-1)^{th}$ and a $(2k)^{th}$ data input of the corrector are connected to the respective two data inputs of the k C-elements (C1 21, . . . , Ck 2k) and a data output of a $j^{th}$ C-element (Cj 2j; j=1, . . . , k) is a $j^{th}$ data output of the corrector.

In one advantageous embodiment of the invention, it may be provided that the error detection circuit is designed so as to form during operation an error signal which is dependent on one or more of the following information items suitable for evaluation: the m-dimensional binary data input (x1, . . . , xm), data values on internal circuit lines of the functional circuit, the data content of the at least two registers and the k-dimensional corrected data output (y(korr)).

In one advantageous embodiment of the invention, it may be provided that the following features are configured for the case where k=n: the functional circuit is a combinatorial circuit with an m-bit-wide data input and an n-bit-wide data output for forming the n-dimensional data output (y=y1, . . . , yn), and a duplicating circuit part is provided for producing from the U-dimensional data output (y) two respectively n-bit-wide duplicate data outputs (y, y'), wherein a first duplicate data output (y) of the duplicating circuit part is passed to an n-dimensional data input of a first register and a second duplicate data' output (y') of the duplicating circuit part is passed to an n-bit-wide data input of a second register, and wherein an n-bit-wide data output of the first register and an n-bit-wide data output of the second register are passed in a positionally correct manner to a 2n-bit-wide data input of the corrector, which supplies an n-dimensional corrected data output (y(korr)).

One preferred further development of the invention provides that the error detection circuit comprises a predictor, an L-bit-wide further register, a comparator and a generator, wherein L is the number of control positions of a code which is used, and that at least one circuit configuration is formed from the following group of circuit configuration elements: the m-dimensional binary data input (x1, . . . , xm) is passed to a data input of the predictor, an L-bit-wide data output of the predictor is connected to an L-bit-wide data input of the further register, an L-bit-wide data output of the further register is passed to a first L-bit-wide data input of the comparator, a data output of the generator is passed to a second L-hit-wide data input of the comparator, and a data input of the generator is connected to the n-dimensional corrected data output (y(korr)) of the corrector.

One preferred further development of the invention provides that at least one circuit configuration is formed from the following group of circuit configuration elements: the predictor is configured to determine L control bits or check bits $(c1(x), \ldots, cL(x))$ of an error-detecting code comprising m information bits and L control bits from the m-dimensional binary data input $(x1, \ldots, xm)$, the generator is configured to form L further control bits $(c(y1(korr)), \ldots, c(yL(korr)))$ of the error-detecting code from the k-dimensional corrected data output (y(korr)) output from the corrector, and the comparator is configured to compare the L control bits $(c1(x), \ldots, cL(x))$ with the L further control bits $(c(y1(korr)), \ldots, c(yL(korr)))$ and to indicate an error if the L control bits $(c1(x), \ldots, cL(x))$ and the L further control bits $(c(y1(korr)), \ldots, c(yL(korr)))$ do not correspond bit-by-bit.

In one convenient embodiment of the invention, it may be provided that, for L=1, the predictor is configured to generate a control bit designed as a parity bit, and the generator is an XOR tree with n binary data inputs, to which the k-dimensional corrected data output (y(korr)) is applied.

One advantageous embodiment of the invention provides that the comparator is formed of an output line of the further register, a data input of the latter being connected to a data output of the predictor, and of an output line of the XOR tree.

One preferred further development of the invention provides that the output lines which form the comparator, namely the output line of the further register and the output line of the XOR tree, are linked by means of an XOR gate or an XNOR gate to form a data output which carries a binary error signal.

One preferred further development of the invention provides that the functional circuit is formed of a first combinatorial circuit and of a second combinatorial circuit which is functionally equivalent to the first combinatorial circuit.

In one convenient embodiment of the invention, it may be provided that the functional circuit is formed of two duplicate functionally equivalent circuits, wherein: a first circuit comprises two combinatorial circuit parts and a register for storing an internal state (z), a second circuit comprises two further combinatorial circuit parts and a further register for storing a further internal state (z'), one of the two combinatorial circuit parts is functionally equivalent to one of the further two circuit parts, and another of the two combinatorial circuit parts is functionally equivalent to another of the further two circuit parts.

One advantageous embodiment of the invention provides that at least one circuit configuration is formed from the following group of circuit configuration elements: lines which carry the m-dimensional binary data input (x, x', where x=x') are passed to a respective primary data input of the two combinatorial circuit parts and of the two further combinatorial circuit parts; an L-bit-wide data output of the other of the two combinatorial circuit parts, which carries a value of the internal state (z), is passed to an L-bit-wide data input of the register for storing the internal state (z) of the first of the duplicate circuits, while an L-bit-wide data output of the other of the two combinatorial circuit parts, which carries a value of the further internal state (z') of the second of the duplicate circuits, is passed to an L-bit-wide data input of the further register for storing the further internal state (z'); a k-bit-wide data output of one of the two combinatorial circuit parts is passed to a k-bit-wide data input of one of the at least two registers, wherein a k-bit-wide data output of one of the at least two registers is connected in a positionally correct manner to k data inputs of a first corrector with 2k data inputs and k data outputs, while a k-bit-wide data output of the other of the two combinatorial circuit parts is passed to the k-bit-wide data input of the other of the at least two registers, wherein a k-bit-wide data output of the other of the at least two registers is connected in a positionally correct manner to the remaining k data inputs of the first corrector, at the k-bit-wide data output of which the k-dimensional corrected data output (y1(korr), yk(korr)) is output; and an L-bit-wide data output of the register for storing the internal state (z) is passed in a positionally correct manner to L data inputs of a second corrector with 2 L data inputs and L data outputs, while an L-bit-wide data output of the further register for storing the further internal state (z') is connected in a positionally correct manner to the remaining L data inputs of the second corrector, wherein an L-bit-wide data output of the second corrector, which carries a corrected signal (z(korr)), is connected simultaneously to respective second data inputs of the two combinatorial circuit parts and of the two further combinatorial circuit parts.

One preferred further development of the invention provides that the error detection circuit is configured to include in the error detection at least one data output of the register, which carries the value of the internal state (z), and at least one data output of the further register, which carries the value of the further internal state (z').

One preferred further development of the invention provides that the error detection circuit is configured to include in the error detection at least one data output of the second corrector.

In one convenient embodiment of the invention, it may be provided that the following circuit configuration elements are also formed: a data output of one of the at least two registers is connected simultaneously to a first data input of a first comparator and to a first data input of a third comparator, a data output of one of the at least two registers is connected simultaneously to a second data input of the first comparator and to a first data input of a second comparator, a data output of the corrector, which carries a corrected output value y(korr), is simultaneously connected to a second data input of the second comparator and to a second data input of the third comparator, and the first, the second and the third comparator are configured to output an error signal at a respective data output if data inputs do not correspond.

One advantageous embodiment of the invention provides that a respective data output of the first comparator, of the second comparator and of the third comparator is connected to data inputs of an evaluation logic, wherein the evaluation logic is configured to determine a defective circuit element.

One preferred further development of the invention provides that the following circuit configuration elements are also formed: a data output of the other of the at least two registers is connected to data inputs of a first generator for generating control bits of an error-detecting code, wherein the first generator is configured to output, at a data output, control bits of input values of the first generator, a data output of one of the at least two registers is connected to data inputs of a second generator for generating control bits of the error-detecting code, wherein the second generator is configured to output, at a data output, control bits of input values of the second generator, and a data output of the corrector, which carries a corrected output value y(korr), is connected to a data input of a third generator for generating control bits of the error-detecting code, wherein the third generator is configured to output, at a data output, control bits of input values of the third generator.

One preferred further development of the invention provides that the error-detecting code is a parity code, and that the first generator, the second generator and the third generator for generating control bits are designed as an XOR tree for generating parity bits of the parity code.

In one convenient embodiment of the invention, it may be provided that the following circuit configuration elements are also formed: a data output of a first XOR tree is passed simultaneously to a first data input of an OR gate and, inverted, to a first data input of a further OR gate, a data output of a second XOR tree is passed to a second data input of the OR gate and, inverted, to a second data input of the further OR gate, a data output of a third XOR tree is passed to a third data input of the OR gate and, inverted, to a third data input of the further OR gate, and a data output of the OR gate is passed to a first data input of an AND gate and a data output of the further OR gate is passed to a second data input of the AND gate, wherein a data output of the AND gate carries an error signal.

One advantageous embodiment of the invention provides that data outputs of the first generator, of the second generator and of the third generator are connected to data inputs of an evaluation logic, wherein the evaluation logic is configured to determine a defective circuit element.

One preferred further development of the invention provides that at least one of the outputs of the register for storing the internal state (z), of the further register for storing the further internal state (z') or of the second corrector is included in the error detection in such a way that at least one output of the further register is connected to a further input of the predictor, at least one output of the register is connected to a further input of the predictor or at least one output of the second corrector is connected to a further input of the predictor.

One preferred further development of the invention provides that the functional circuit comprises a plurality of combinatorial circuit parts and is configured to carry out a pipeline processing of the m-dimensional binary data input (x1, ..., xm) to form the n-dimensional data output (y1, ..., yn), wherein outputs of at least one of the plurality of combinatorial circuit parts are passed to duplicate registers and the at least one corrector is coupled to the data outputs of the duplicate registers.

In one advantageous embodiment of the invention, it may be provided that the error detection circuit is formed as a common error detection circuit for at least two pipeline stages.

Advantageously; outputs of the duplicate registers may also be integrated in the error detection circuit, so that permanent errors in the registers can be detected immediately. In one specific embodiment, there are also further additional output signals of the clocked digital circuit, which in the event of an error make it possible, besides indicating an error, also to directly identify defective circuit parts. In particular embodiments it is provided that the hardware of the various functionally described circuit parts is used at least partially in common.

If a pipeline structure is provided for processing the input values to form the output values, then the error correction may be carried out only for one sub-set of the pipeline registers, again for complexity reasons.

DESCRIPTION OF PREFERRED EXAMPLES OF EMBODIMENTS OF THE INVENTION

The invention will be explained in more detail below on the basis of preferred examples of embodiments and with reference to figures, in which:

FIG. 4 shows the table of values for a C-element;

FIG. 10b shows a modification of the circuit arrangement in FIG. 10a;

FIG. 11 shows the table of values for an evaluation logic for the parity signals of the circuit arrangement of FIG. 10a.

The circuit arrangement consists of the functional circuit S 11, to the input of which the m-dimensional input value x is applied and which outputs at its first n data outputs the n-dimensional output value y=y[k], y[n−k] and at its further k data outputs the n-dimensional output value y[k]', wherein the output value y[k]' is either identical to y[k] or identical to y[k] with bitwise inversion. Here, y[k], y[k]' in each case denote a k-bit-wide output value and y[n−k] denotes an (n−k)-bit-wide output value. y[k] and y[n−k] together form an n-dimensional output value. The functional circuit may have additional circuit outputs 16, which serve for error detection.

The first k data outputs of the first data output of the circuit S 11, which carry the output value y[k], are passed to the k inputs of a first register R1 12 having k inputs and k outputs, while the following n−k data outputs y[n−k] of the first data output are connected directly to n−k components of the circuit output. The second k data outputs, which carry the output value y[k]', are passed to the k inputs of a second register R2 13 having k inputs and k outputs.

For i=1, ... k, the respective $i^{th}$ output of the register R1 12 is connected to the $(2i-1)^{th}$ input of a corrector K 14 having 2k inputs and k outputs, while the $i^{th}$ output of the register R2 is connected to the $2i^{th}$ input of the corrector K 14. The corrector K outputs at its k outputs the corrected value y[k](korr).

The outputs of the registers R1 12, R2 13, of the corrector K 14, an additional output 16 of the functional circuit S 11 and the inputs of the circuit S 11 carrying the input values x are passed to the corresponding inputs of an error detection circuit F 15, which outputs at its output an error signal "error signal".

The output of the corrector 14, which carries the corrected signal y[k](korr), is expressly included in the error detection, so that errors in incorrectly corrected values, in the functional circuit, in the registers and in the corrector can be detected in the error correction circuit F 15.

For k=n, y[k]=y[n] is identical to y and also y[k]'=y[n]' is identical to y', and for k=n, y[k](korr)=y[n](korr) with y(korr).

Figure 1:
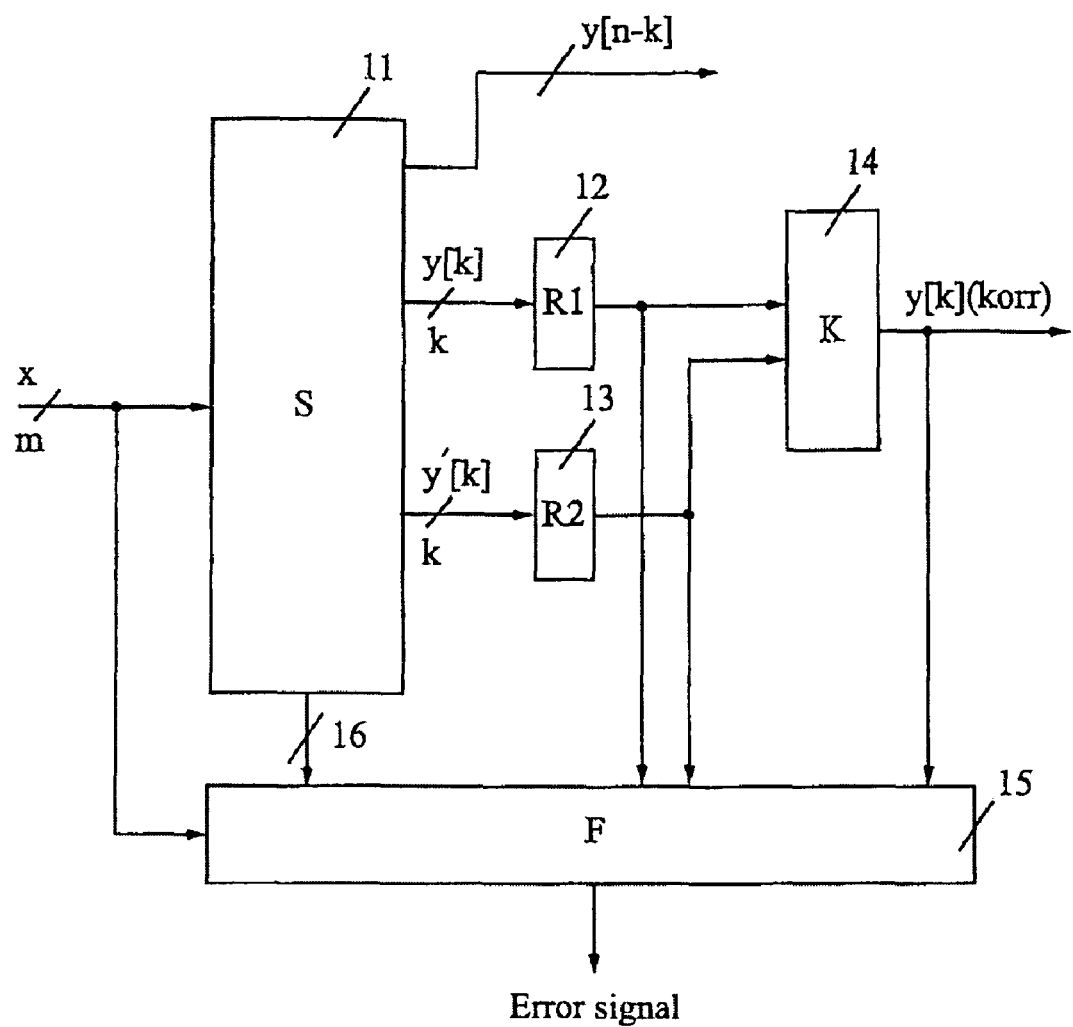
FIG. 1 shows a circuit arrangement for correction and error detection for a functional circuit.
Figure 2:
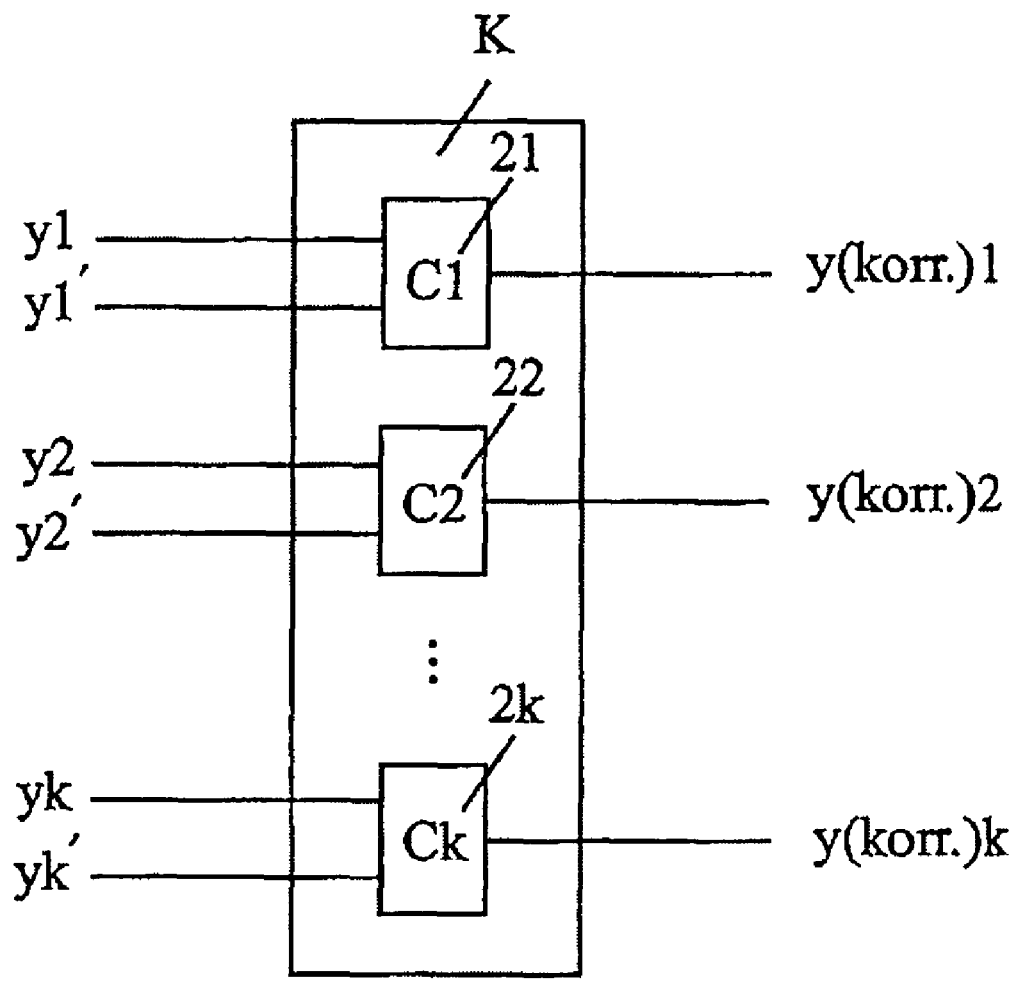
FIG. 2 shows a corrector composed of C-elements with 2k inputs and k outputs.

FIG. 2 shows the structure of the corrector K 14 with 2k inputs and k outputs as a parallel connection of k C-elements C1 21, C2 22, ..., Ck 2k, each having two inputs and one output. The input values applied to the 2k inputs of the corrector K are y1, y1', y2, y2', ..., yk, yk'. The values output at the k outputs of the corrector are y(korr)1, y(korr)2, ..., y(korr)k. C-elements are known per se in various embodiments (cf. for example in Shams et al., "Optimizing CMOS Implementations of the C-element", Proc. ICCD 97, 1997; in Shams et al., "Modelling and Comparison CMOS Implementations of the C-Element", Trans. VLSI-Systems, vol. 6, pages 563-567, 1998).

Figure 3:
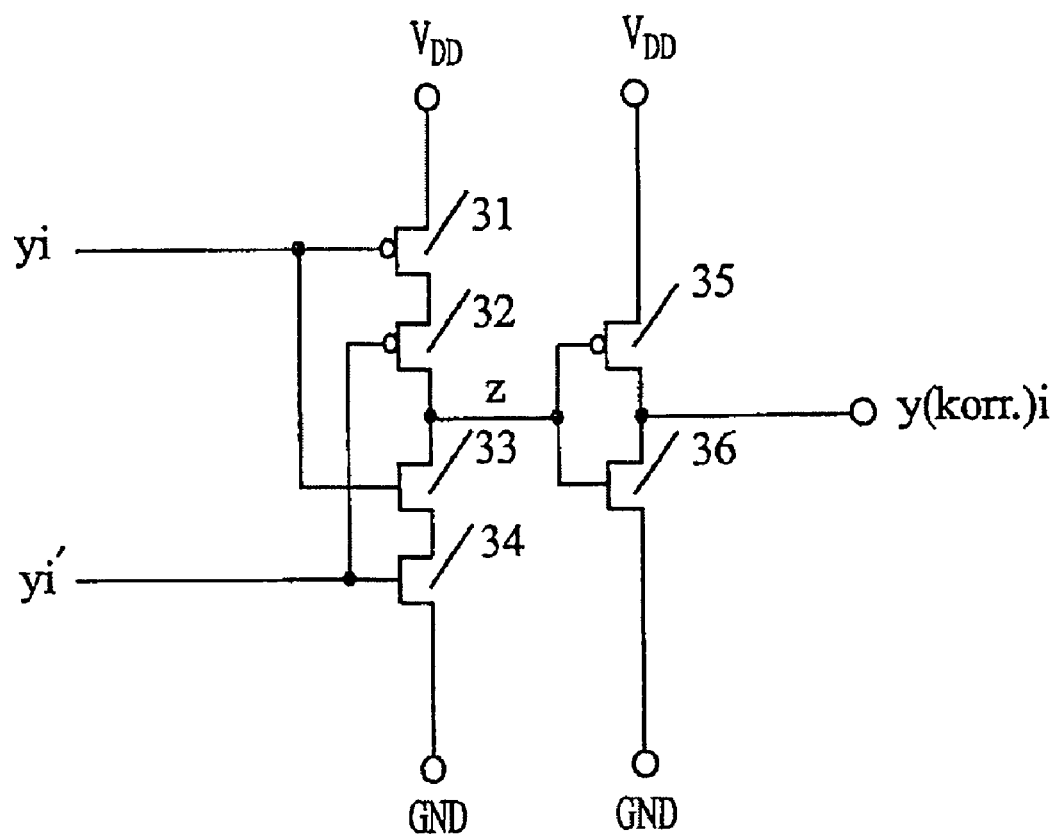
FIG. 3 shows an implementation of a C-element composed of transistors in CMOS.

In order to further explain the mode of operation, FIG. 3 shows a particular CMOS implementation of a CMOS element, as used for example in Kundu et al. "Self-Checking Komparator with One Periodic Input", IEEE Trans. Comp. vol. 45, pages 379-380, 1996.

The C-element in FIG. 3 is composed of the p-transistors 31, 32, 35 and the n-transistors 33, 34, 36. The input of the C-element carrying the value yi is connected to the p-transistor 31 and to the n-transistor 33, while the input carrying the value yi' is connected to the p-transistor 32 and the n-transistor 34. If the values yi=yi'=0 are then applied to the inputs of the C-element, the transistors 31 and 32 are on and the transistors 33, 34 are off, so that the line denoted z is connected to the voltage VDD and carries the value 1 (high). The transistor 36 is then on and the transistor 35 is off, so that the output denoted y(korr)i carries the value 0 (low), which corresponds to the value of yi=yi'=0. In the same way, it can be seen that when yi=yi'=1 is input, the value y(korr)i=1 is output at the output of the C-element.

The case will now be considered where yi=1 and yi'=0. The transistors 31 and 34 are then off, while the transistors 32 and 33 are on. The line carrying the value z is thus connected neither to VDD nor to GND, and it retains its previous value, so that the previous value of y(korr)i is also output at the output of the C-element. A similar behaviour occurs when yi=0 and yi'=1.

FIG. 4 shows the table of values for the output y(korr)i of a C-element for the different inputs yi, yi' and the corresponding previous values yvi.

For instance, it can be seen from the first row of the table in FIG. 4 that the value y(korr)i=0 is output if yi=0 and yi'=0 are input and the previous value was yvi=0. It can be seen from the third row that the output is y(korr)i=0 if yi=1, yi'=0 was input if the previous value was yvi=0.

Modifications of C-elements are known per se (cf. for example Shams et al., "Optimizing CMOS Implementations of the C-element", Proc. ICCD 97, 1997; in Shams et al., "Modelling and Comparison CMOS Implementations of the C-Element", Trans. VLSI-Systems, vol. 6, pages 563-567, 1998).

Figure 5:
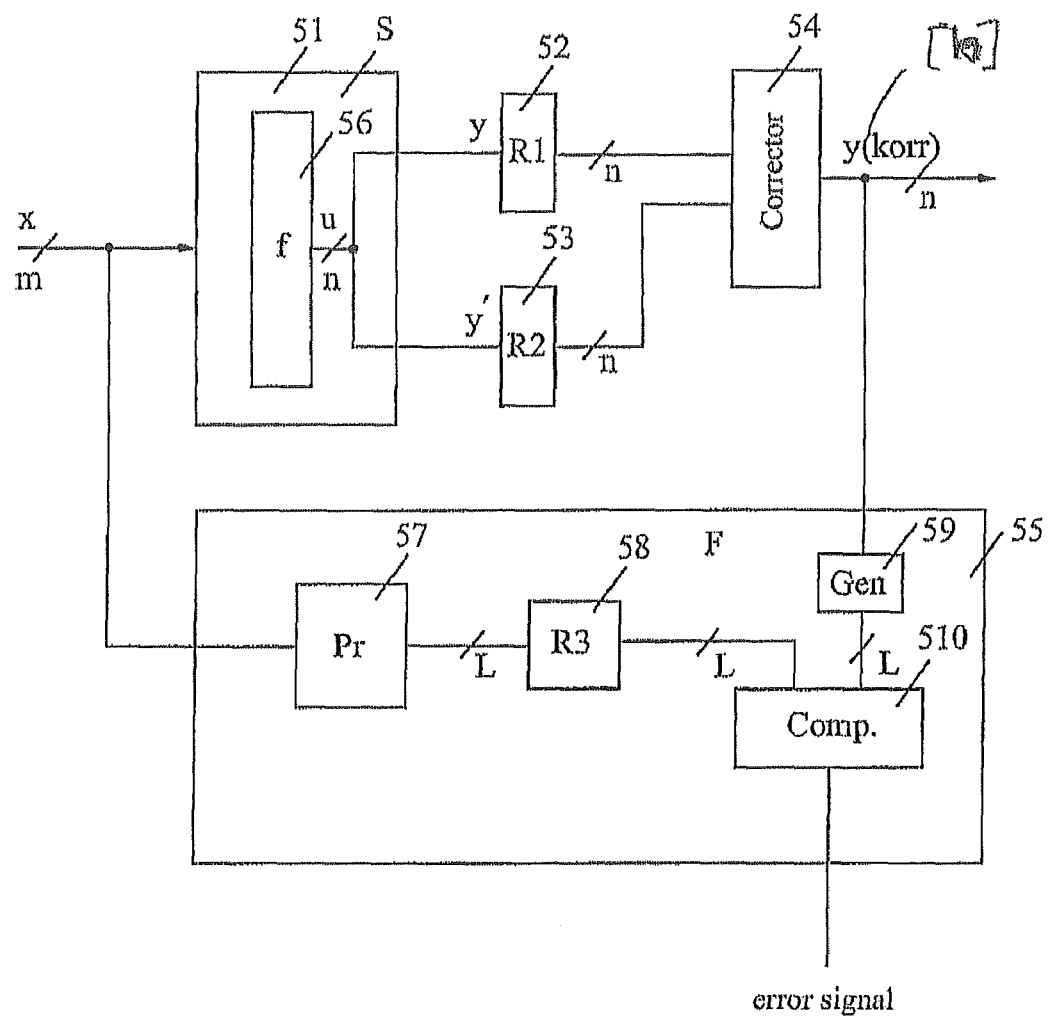
FIG. 5 shows a circuit arrangement for correction and error detection for a combinatorial circuit using a separable error-detecting code.

FIG. 5 shows a circuit arrangement for error correction and error detection using a systematic error-detecting code.

Here, the circuit S 51 consists of a combinatorial circuit f 56 with an n-dimensional output u which is duplicated in the two n-dimensional outputs y and y'. The first duplicate n-dimensional output y is passed to a first register R1 52 having n inputs and n outputs, while the second duplicate n-dimensional output y' is passed to a second register R2 53 having n inputs and n outputs.

For i=1, ..., n, the respective $i^{th}$ output of the register R1 52 is connected to the $(2i-1)^{th}$ input of a corrector K 54 having 2n inputs and n outputs, while the $i^{th}$ output of the register R2 53 is connected to the $2i^{th}$ input of the corrector K 54. The corrector K 54 outputs at its n outputs the n-dimensional corrected value y(korr).

The error detection circuit F 55 consists of a predictor 57, a register 58, a generator 59 and a comparator 510. For error detection, in FIG. 5 use is made of a separable code comprising n information bits and L control bits.

To describe the mode of operation of the circuit, it is assumed that the combinatorial circuit f 56, as a function of its input values x=x1, ..., xm, outputs at its n outputs the values y1=f1(x), ..., yn=fn(x), wherein f1, ..., fn are in each case m-ary Boolean functions.

The n information bits of the code in question are the bits y1, ..., yn. The predictor Pr 57 then determines, as a function of the input values x, the L control bits c1(x), ..., cL(x), which are buffer-stored in a register 58 having L inputs and L outputs. The generator Gen 59 then determines from the corrected output values of the corrector 54 y(korr)=y(korr)1, ..., y(korr)n of the information bits of the code in question, as a function of these output values, also the control bits c1(y(korr)), ..., cL(y(korr)). c1(x), ..., cL(x) and c1(y(korr)), ... cL(y(korr)) are checked in the comparator 510 to check that they are identical. A difference indicates an error.

The error correction and the error detection in FIG. 5 will now be explained.

An error in the function f, i.e. in the combinatorial circuit part of the circuit, is checked by the error detection circuit. An error in the combinatorial circuit f 56 leads to an incorrect output value u' instead of u at the output of f. The incorrect value u' is then stored both in the register R1 52 and in the register R2 53 and is not corrected by the corrector 54, since the inputs are (incorrectly) the same, and y(korr)=u' is output.

If an error-correcting code has been selected which is able to detect this error, then the generator Gen 55 generates incorrect control bits c1(u'), ..., cL(u'), which differ from the control bits c1(x), ..., cL(x) generated from the input values x, and the error is detected.

An error in one of the registers, for instance in R1 52, leads to different values being applied to at least two corresponding inputs of the corrector, for example to the $(2j-1)^{th}$ input and to the $2j^{th}$ input of the corrector 54, and the corrector outputs the previous value y(korr)vj at the $j^{th}$ output. If y(korr)vj equals the expected correct value, then no error occurs and an error is of course not detected. If y(korr)vj does not correspond to the expected correct value, then an error occurs at the output of the corrector. The generator Gen 55 generates incorrect control bits which differ from the control bits c1(x), ..., cL(x) generated from the input values x, if the selected code makes it possible to detect the error. Such an error is detected by the comparator Comp 510.

If an output value of the corrector 54 is incorrect due to an error of the corrector, the generator Gen 59 generates incorrect control bits of the code which are compared with the correct control bits determined by the input values x and cause an error signal.

If a soft error then occurs in one of the registers, for example in the register R2 53, this affects the $j^{tb}$ output of this register. The output value at the $j^{th}$ output of the register is then correct in the first half of the cycle for the value of the clock signal clock=1 and is incorrect in the second half of the cycle for the value of the clock signal clock=0. The correct value yj is then applied to the $(2j-1)^{th}$ input both for clock=1 and for clock=0, while at the $2j^{th}$ input the correct value yj'=yj is applied for clock=1 and the (inverted) incorrect value of yj is applied for clock=0. The corrector 54 then outputs the correct value yj at its $j^{th}$ output both for clock=1 and for clock=0.

It should be emphasized that, for the correction of soft errors and for error detection both of the errors in the combinatorial circuit part f 56, the registers R1 52, R2 53, the corrector 54 and also the corrected output values, all that is required is to duplicate the registers R1 52 and R2 53, which can also be embodied with relatively little complexity as latches, and the complexity of which for error detection can be adapted to the required certainty of error detection by selecting different error-detecting codes.

The error detection in the error detection circuit likewise takes place by comparing the control bits determined from the input values and the control bits determined from the corrected output values.

If use is made of a corrector in which the C-element outputs the previous output value in the case of input values which are identical to one another in pairs, the outputs of one of the registers R1 or R2 must be inverted.

Figure 6:
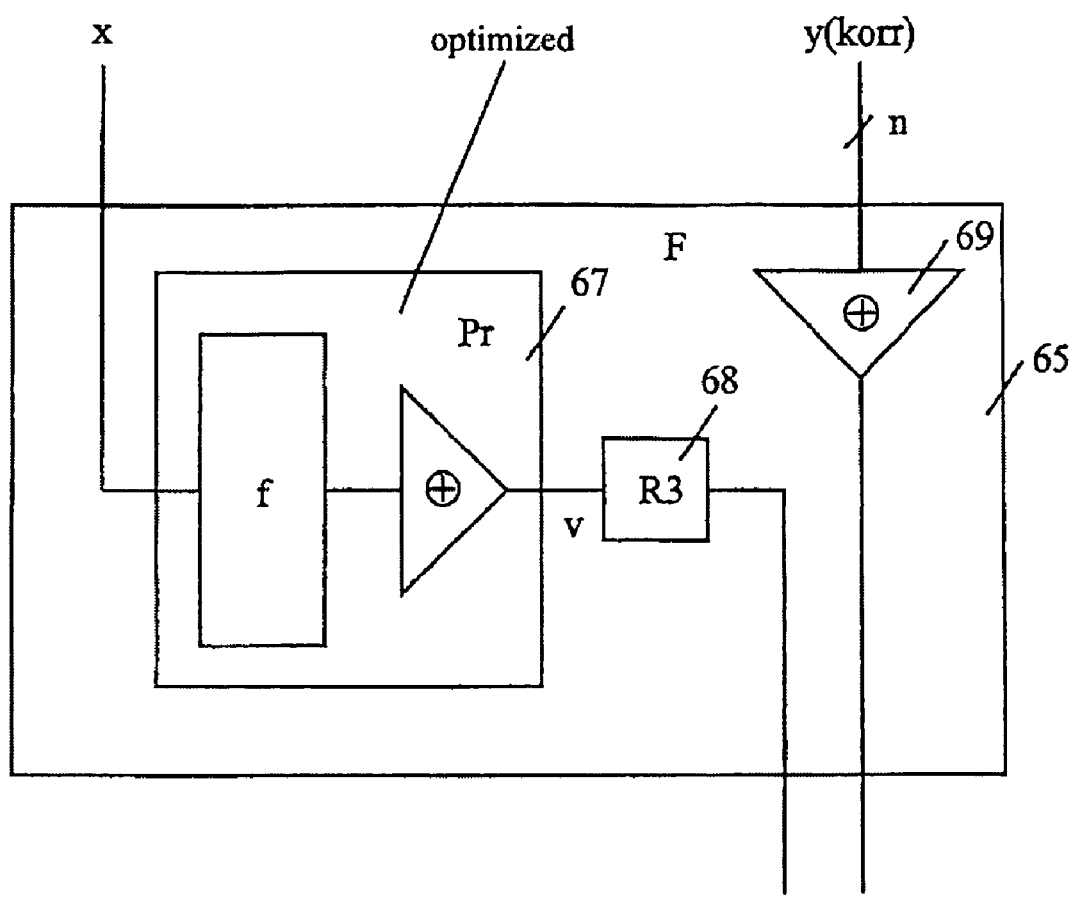
FIG. 6 shows an error detection circuit using a parity code.

FIG. 6 shows a particularly simple form of the error detection circuit for the simplest separable code, the parity bit code.

It is assumed that the combinatorial circuit f 56 in FIG. 5 implements the Boolean functions f1($x$), ..., fn($x$), so that the output values y1, ..., yn are determined by y1=f1($x$), ..., yn=fn($x$). The predictor 67 in FIG. 6 then determines the function v=y1($x$)XOR y2($x$) XOR ... XOR yn($x$)=fi(1) XOR f2(X)XOR ... XOR fn($x$).

In practice, the predictor 67 can then be embodied in such a way that the outputs of the combinatorial circuit are XOR-linked by a parity tree and the circuit thus obtained is optimized with a CAD synthesis tool. This procedure is illustrated in FIG. 6 by the fact that the predictor 67 is shown as a series connection of the combinatorial circuit f and a parity tree, wherein this series connection must be optimized.

The register R3 68 here has a width of just 1 bit, and the generator G 59 in FIG. 5 consists in FIG. 6 of an XOR tree 69 which forms the parity of the outputs y(korr)1, ..., y(korr)n. A comparator can either be omitted here, if a two-dimensional output is permitted, or else it can be embodied by a simple XOR element having two inputs and one output, which is to be connected to the output of the XOR tree 69 and to the output of the register R3 and which is not shown in FIG. 6.

Figure 7:
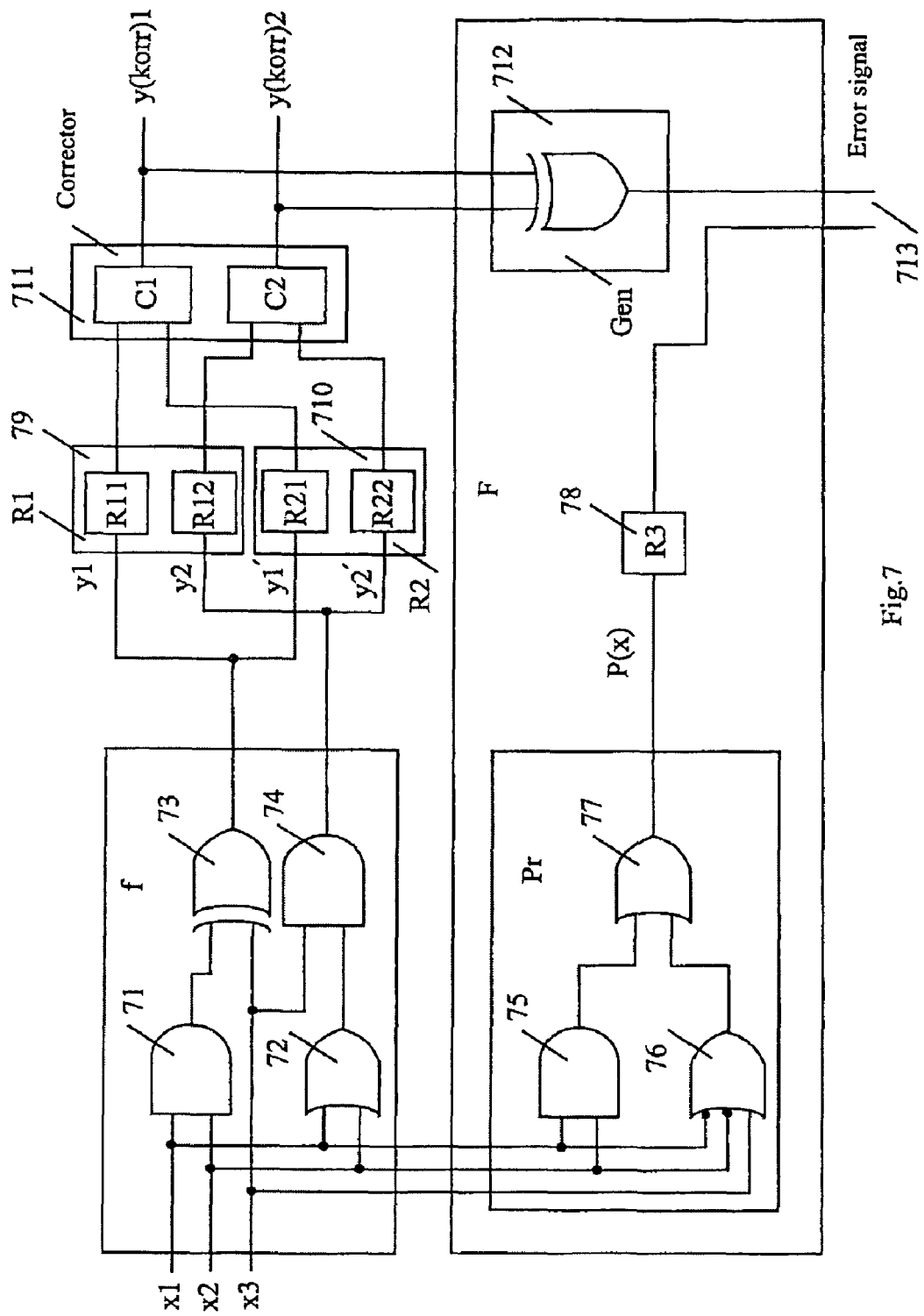
FIG. 7 shows a circuit arrangement for a particular combinatorial circuit.

FIG. 7 shows a specific embodiment of a circuit according to FIG. 5, wherein the error-detecting code is selected as a parity code.

The combinatorial circuit f has three inputs x1, x2 and x3 and two outputs y1 and y2, which are split into y1' and y2'. The following apply: y1($x$)=f1($x$)=(x1 AND x2) XOR x3, y2($x$)=f2($x$)=(x1 OR x2) AND x3. The predictor Pr determines the parity P(x) of y1($x$) and y2($x$) as P($x$)=y1($x$) XOR y2($x$)=(x1 AND x2) OR ($\overline{x}$1 AND $\overline{x}$2 AND x3).

The input carrying the input signal x1 is connected to the first input of an AND gate 71, to the first input of an OR gate 72, to the first input of an AND gate 75 and, inverted, to the first input of a further AND gate 76. The input carrying the input signal x2 is connected to the second input of the AND gate 71, to the second input of the OR gate 72, to the second input of the AND gate 75 and, inverted, to the second input of the AND gate 76.

The input carrying the input signal x3 is simultaneously connected to the first input of an XOR gate 73, to the first input of an AND gate 74 and to the third input of the AND gate 76. The output of the AND gate 71 is passed to the second input of the XOR gate 73, the output of which is the first output of the combinatorial circuit f, which carries the output signal y1. The output of the OR gate 72 is connected to the second input of the AND gate 74, the output of which is the second output of the combinatorial circuit f, which carries the output signal y2. The output of the AND gate 75 is connected to the first input of an OR gate 77, to the second input of which the output of the AND gate 76 is passed and the output of which is the output of the predictor Pr, which is passed to the input of the 1-bit-wide register R3 and which forms at its output the parity P(x) of the functions y1($x$)=f1($x$) and y2=f2($x$).

The output line of the XOR gate 73, which is the first output of the combinatorial circuit f, is split into two lines which carry the values y1 and y1' and are connected to the inputs of the two memory elements R11 and R21. The output line of the AND gate 74, which is the second output of the combinatorial circuit f, is split into two lines which carry the values y2 and y2' and are connected to the inputs of the two memory elements R12 and R22.

The memory elements R11 and R12 are combined to form a register R1 79, and the memory elements R21 and R22 are combined to form the register R2 710. The first output of the register R1 79 is passed to the first input of the corrector 711, and the first output of the register R2 710 is passed to the second input of the corrector 711. The second output of the register R1 79 is passed to the third input of the corrector 711, and the second output of the register R2 710 is passed to the fourth input of the corrector 711. The corrector 711 consists of the parallel connection of two C-elements C1, C2. The first output of the corrector 711 carries the first corrected signal y(korr)1, and the second output of the corrector 711 carries the second corrected signal y(korr)2.

The first output of the corrector 711 is connected to the first input of an XOR gate 712, while the second output of the corrector 711 is connected to the second input of the XOR gate 712. The XOR gate 712 forms the generator Gen of the circuit arrangement. The parity P(y(korr)1, y(korr)2)=y (korr)1 XOR y(korr)2 is output at its output. This output together with the output of the register R3 78 forms the two-bit-wide output 713 of the error detection circuit F, which carries the error signal. If the two bits of the error signal at the output 713 correspond, then no error is indicated. If the two bits of this signal are different, then an error exists either in the combinatorial circuit f, in the registers R1 79, R2 710, in the register R3 78, in the corrector 711, in the generator 712 or in the predictor Pr.

If a 1-bit-wide error signal is to be determined, then the 1-bit-wide output of the register R3 78 and the output of the generator 721 are simply linked by a further XOR gate, which is not shown in FIG. 7.

The mode of operation of the error correction and error detection will now be explained on the basis of examples.

There will first be described the correction of a soft error which occurs in the memory element R11 of the register R1 79. By way of example, the correct value y1 output from the XOR gate 73 is equal to 1. This value is duplicated in y1'=1, so that the value 1 is applied both to the input of the memory element R11 in the register R1 79 and to the input of the memory element R21 of the register R2 710.

If a soft error occurs in the memory element R11, then the output value of the memory element R11 is equal to 1 in the first half of the cycle, when the clock signal clock of the memory element R11 is equal to 1, and is equal to 0 in the second half of the cycle, when the clock signal clock is equal to 0. The output value of the memory element is in each case equal to 1 both for the clock signal clock=1 and for the clock signal clock=0. It can be seen from Table 4, which shows the table of values for a C-element, that the C-element C11 of the corrector K 711 outputs the value 1 both in the first half of the cycle and in the second half of the cycle, so that the soft error is corrected, as will be explained below.

In the first half of the cycle where clock=1, then y1=y1'=1, and it can be seen from the fourth and seventh rows of Table 3 that the C-element C1 outputs the value y(korr)1=1 regardless of the previous value. In the second half of the cycle where clock=0, then y1=0 and y'=1. The previous value of the first half of the cycle is equal to 1 here, and the C-element C1 corrects the value and outputs the correct value y(korr)1=1 as shown in the seventh line of Table 4.

As an example of the detection of an error in the combinatorial circuit f, a stuck-at-0 error at the output of the AND gate 71 will now be considered.

The values x1=1, x2=1, x3=0 are considered as input values for the circuit f. The correct output values of the XOR gate 73 and of the AND gate 74 are then y1=y1'=1, y2=y2'=0. Due to the stuck-at-0 error at the output of the XOR gate 73, the incorrect output of this gate is now y1f=y1'f=0, so that the incorrect values 0 instead of the correct values 1 are stored in the memory elements R11 and R12 of the registers R11 79 and R2 710. The incorrect values 0,0 are applied to the first two inputs of the corrector K 711, which outputs the value y(korr)1=0 at its first output.

The gate 74 outputs the correct value y2=y2'=0, which is stored in the memory elements R12 of the register R1 79 and R22 of the register 719. The correct values 0,0 are applied to the third and fourth inputs of the corrector K 711, so that the value 0 is output by the corrector K 711 at its second output. The two outputs of the corrector K 711 are passed to the two inputs of the generator Gen 712, which is embodied as an XOR gate and outputs the value 0 XOR 0=0 at its output.

The input signals x1=x2=1, x3=0 are also applied to the inputs of the predictor Pr, so that the value 1 is output at the output of the AND gate 75 and the value 0 is output at the output of the AND gate 76, which values are processed by the OR gate 77 to form the value P(x)=1, so that the value P(x) is output by the predictor and buffer-stored in the register R3 78. The output 1 of the register R3 78 and the output of the generator 712, which is 0, do not correspond, and therefore an error is indicated.

The detection of an error K 711 in the corrector K 711 will now also be considered. Here, it is assumed that the C-element C1 is implemented as shown in FIG. 3.

We are considering the error that the p-transistor 32 is stuck open and is constantly unable to establish a conductive connection. If the input values x1=x2=1 and x3=1 are applied to the circuit inputs, then the value y2=y2'=1 is output by the AND gate 74, while the gate 73 outputs the value y1=y1'=0. After buffer-storage in the registers R1 79 and R2 710, the values 0,0 are applied to the first two inputs of the corrector 711 and thus to the two inputs of the incorrect C-element C1 and the values are applied to the third and fourth inputs of the corrector and thus to the two inputs of the correct C-element C2.

Since the p-transistor 32 in FIG. 3 is stuck open, when 0,0 is input into the C-element C1 there is neither a conductive connection of the line carrying the value z to VDD or to GND, so that the value z retains its previous value, which in inverted form is also output as y(korr)i at the output of the C-element. Since there is never any connection of the line carrying the value z to VDD, the value z passes to constant 0 over time due to leakage currents, so that the C-element C1 always outputs the value 1 at its output.

This error is always detected by comparing the output signals of the generator Gen 712 and the output values of the generator buffer-stored in the register R3 when the correct output of the XOR gate 73 is 0. The reason is that the output y(korr)2 of the C-element C2 and of the predictor Pr is not falsified by these errors of the corrector 711 and the generator Gen 712 is implemented by an XOR gate which carries out a clearly invertible function.

Figure 8:
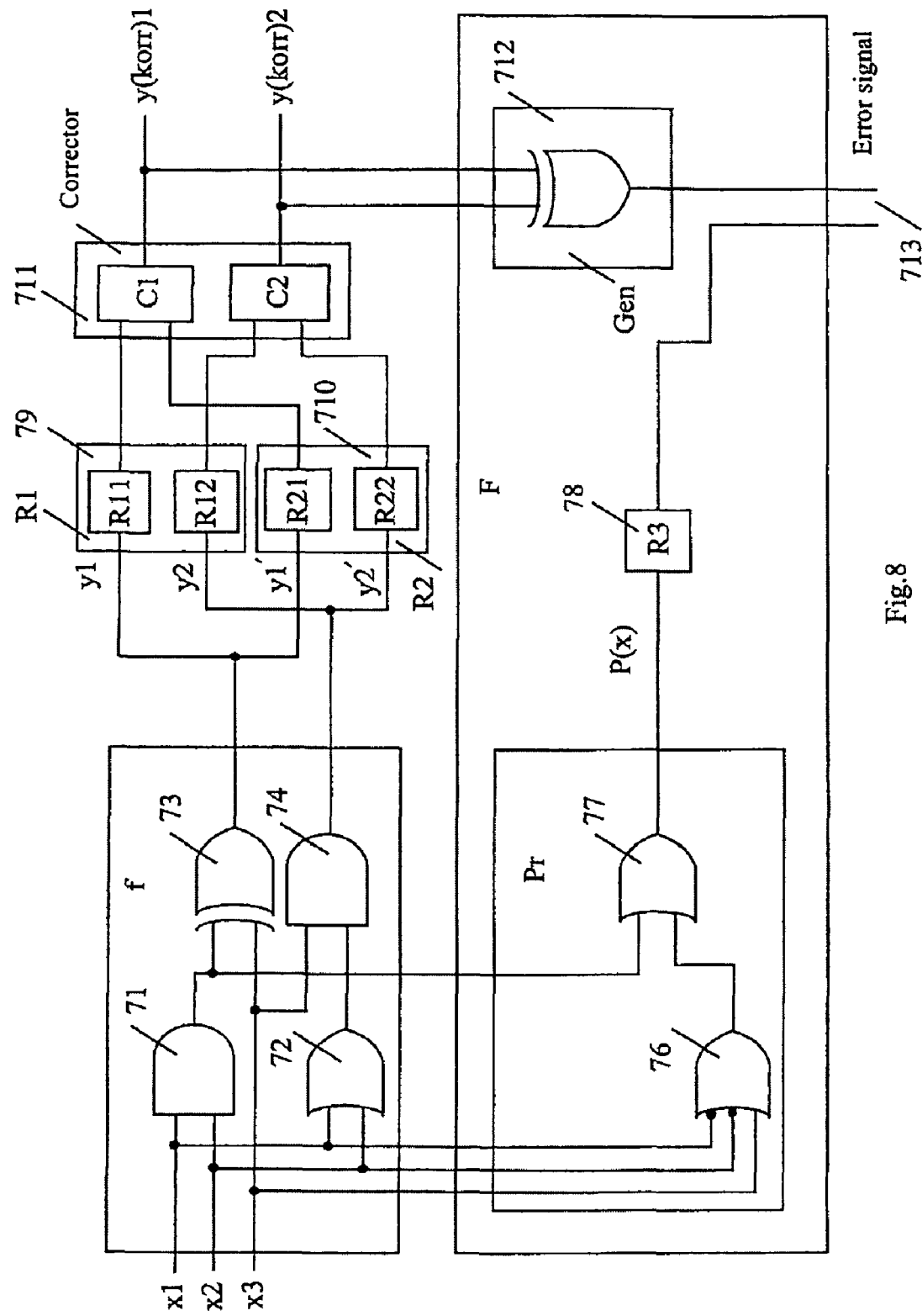
FIG. 8 shows a circuit arrangement for a particular combinatorial circuit, in which parts of the functional circuit and of the error detection circuit are used in common.

FIG. 8 shows a further embodiment of a circuit arrangement according to FIG. 5, wherein the circuit arrangement in FIG. 8 is identical to the circuit arrangement in FIG. 7 in functional terms, but not in structural terms.

The circuit of FIG. 8 differs from the circuit arrangement of FIG. 7 only in that the combinatorial circuit f and the predictor Pr have common circuit parts. In the circuit arrangement shown in FIG. 7, it can be seen that the AND gates 71 and 75 in each case carry out the same function (x1 AND x2). This is taken into account in FIG. 8 by the fact that the output of the AND gate 71 is passed both to the first input of the XOR gate 73 and to the input of the OR gate 77, to which the output of the AND gate 75 is connected in the circuit of FIG. 7. In the circuit of FIG. 8, therefore, there is no need for the gate 75. The output of the AND gate 71 is passed as an additional output of the functional circuit to the error detection circuit 714, as a result of which the error detection circuit and the functional circuit f use the AND gate 71 in common.

Figure 9:
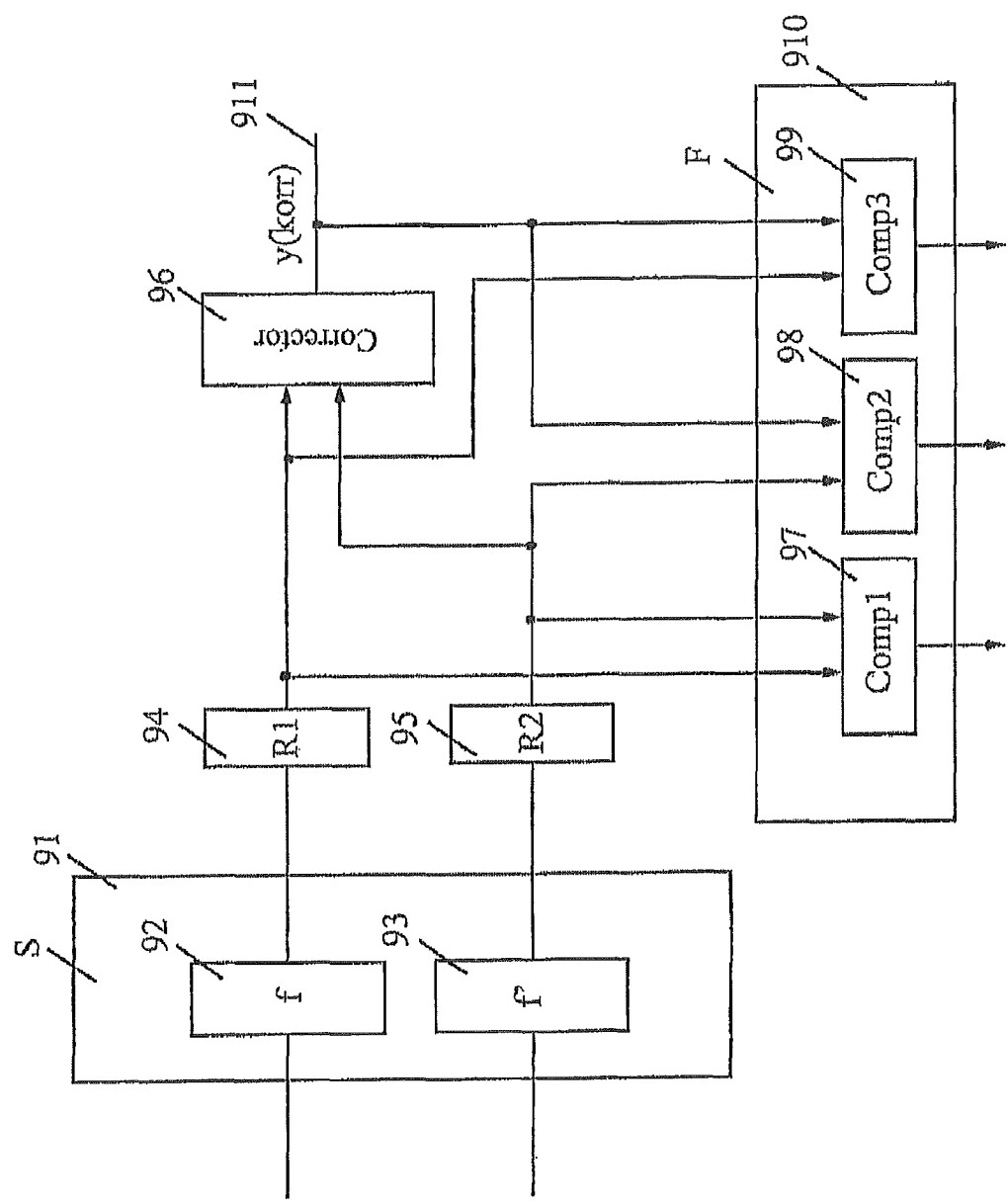
FIG. 9 shows a circuit arrangement for correction and error detection for a duplicate combinatorial circuit.

FIG. 9 shows a further circuit arrangement for correction and error detection.

The functional circuit S 91 consists of two duplicate, identical combinatorial circuits f 92 and f' 93. The output of the combinatorial circuit f 92 is passed to the input of a first register R1 94, while the output of the combinatorial circuit f' is passed to the input of a second register R2 95. The output of the register R1 94 is connected simultaneously to the first input of a first comparator Comp1 97, to the first input of a third comparator Comp 3 99 and to the first input of a corrector 96. The output of the second register R2 95 is connected simultaneously to the second input of the first comparator Comp1 97, to the first input of a second comparator Comp 2 98 and to the second input of the corrector 96. The output 911 of the corrector 96, which outputs the corrected signal y(korr), is passed simultaneously to the respective second input of the comparator Comp 2 98 and of the third comparator Comp3 99.

The error detection circuit F 910 consists here of the three comparators Comp1 97, Comp2 98, Comp3 99.

Based on the output signals of the error detection circuit F 910, it is possible to identify here which circuit parts are defective. If, for example, the output of the comparator Comp1 97 indicates an error, then an error exists in one of the combinatorial circuits f 92 or f' 93 or in one of the registers R1 94 or 94. If, for example, the comparator Comp 3 99 at its output and the comparator Comp 2 indicate an error, while the comparator Comp 1 97 does not indicate an error, then the output value of the corrector 96 has been incorrectly corrected, while no errors have occurred in the other circuit parts.

The inputs and outputs of the combinatorial circuits f 92, f' 93, of the registers R1 94, R2 95, of the comparators Comp 1 97, Comp 2 98, Comp 3 99 and of the corrector 96 may have either a width of one bit or a width of several bits.

Figure 10A:
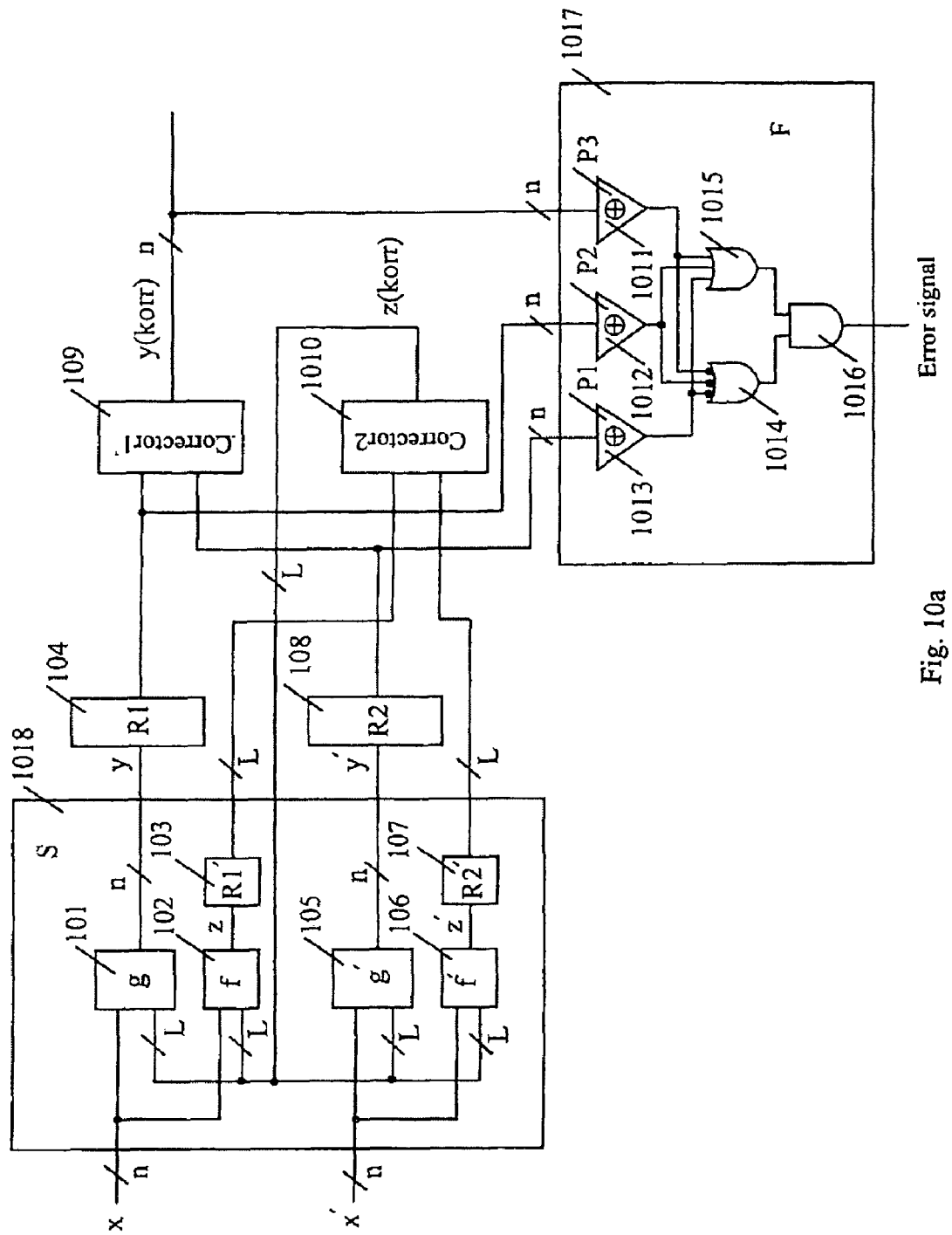
FIG. 10a shows a circuit arrangement for correction and error detection for a duplicate sequential circuit using a parity code.

FIG. 10a shows a further circuit arrangement for error correction and error detection.

The functional circuit S 1018 consists of two identical, duplicate sequential circuits. The first sequential circuit consists of combinatorial circuit parts g 101 and f 102 and a register R1' 103. It is referred to as the original circuit. The state z of the original sequential circuit is stored in the register R1' 103. The feedback of the state takes place via the Corrector2 1010. It will be described below in more detail by the connections of the corresponding circuit parts. The second sequential circuit, which is referred to as the duplicate sequential circuit, consists of combinatorial circuit parts g' 105, f' 106 and a register R2' 107. The state z' of the duplicate sequential circuit is stored in the register R2' 107. The feedback of the state takes place via the Corrector2 1010. It will be described below in more detail by the connections of the corresponding circuit parts. The combinatorial circuit parts g 101 and g' 105 and also the combinatorial circuits f 102 and f' 106 are identical.

The n-bit-wide output of the combinatorial circuit g 101, which carries the value y, is passed to the input of the register R1' 103, while the L-bit-wide output of the combinatorial circuit f 102, which carries the value z which is also referred to as the state of the original circuit, is connected to the input of the register R1' 103.

The n-bit-wide output of the combinatorial circuit g' 105, which carries the value y', is passed to the input of the register R2' 103, while the L-bit-wide output of the combinatorial circuit f' 106, which carries the value z' which is also referred to as the state of the duplicate circuit, is connected to the input of the register R2' 107. Here, both n and L are equal to or greater than 1.

The n-bit-wide output of the register R1 104, like the n-bit-wide output of the register R2 108, is passed to the 2n-bit-wide input of a first corrector Corrector1 109. Here, in each case for i=1, . . . , n, the $i^{th}$ binary output of the register R1 104 is connected to the $(2i-1)^{th}$ input and the $i^{th}$ binary output of the register R2 108 is connected to the $(2i)^{th}$ input of the corrector Corrector1 109.

Furthermore, the n-bit-wide output of the register R1 104 is passed to the n-bit-wide input of a first XOR tree 1012 in order to determine the parity P2 of the n-bit-wide binary output signal of this register.

Furthermore, the n-bit-wide output of the register R2 108 is passed to the n-bit-wide input of a second XOR tree 1013 in order to determine the parity P1 of the n binary output signals of this register.

The L-bit-wide output of the register R1' 103, like the L-bit-wide output of the register R2' 107, is passed to the 2 L-bit-wide input of a second corrector Corrector2 1010. Here, in each case for j=1, . . . , L, the $j^{th}$ binary output of the register R1' 103 is connected to the $(2j-1)^{th}$ input and the $j^{th}$ binary output of the register R2' 107 is connected to the $(2j)^{th}$ input of the corrector Corrector2 1010.

The Corrector1 109 corrects the soft errors in the registers R1 104 and R2 108, while the corrector Corrector2 1010 corrects soft errors in the registers R1' 103 and R2' 107.

The n-bit-wide output of the corrector Corrector1 109, which carries the corrected values of the output values y(korr), is connected to the circuit output and to the n-bit-wide input of a third XOR tree P3 1011 in order to determine the parity P3 of the corrected n-bit-wide output signal y(korr). The respective first n-bit-wide inputs of the combinatorial circuits f 102, g 101, f' 106 and g' 105 are respectively connected to the inputs of the circuit S 1018 which carry the input signal x or x'. Here, x=x'. These respective first inputs of these combinatorial circuits are also called primary inputs.

The L-bit-wide output of the corrector Corrector2 1010, which carries the corrected values z(korr) of the state of the sequential circuit, is fed back to the circuit S 1018 by simultaneously connecting this output to a respective second L-bit-wide input of each of the combinatorial circuits f 102, g 101, f' 106 and g' 105. The respective second inputs of these circuits are also called secondary circuit inputs.

The output of the XOR tree 1013 which carries the parity signal P1 is passed to the first input of a first OR gate 1015 and, inverted, to the first input of a further OR gate 1014.

The output of the XOR tree 1012 which carries the parity signal P2 is passed to the second input of the OR gate 1015 and, inverted, to the second input of the OR gate 1014.

The output of the XOR tree 1011 which carries the parity signal P3 is passed to the third input of the OR gate 1015 and, inverted, to the third input of the OR gate 1014. The output of the OR gate 1014 is passed to the first input of an AND gate 1016. The output of the OR gate 1015 is passed to the second input of the AND gate 1016. The output of the AND gate 1016 carries the error signal. The XOR trees 1013, 1012, 1011, the OR gates 1014 and 1015 and the AND gate 1016 form the error detection circuit F 1017. It can be seen that the error detection circuit F 1017 outputs at its output an error signal equal to 1 if not all three parity values P1, P2 and P3 are the same.

Through the parity, therefore, the error detection circuit detects detectable errors in the combinatorial circuit parts g 101, g' 105, R1 104, R2 108 and in the corrector Corrector1 109 directly. These are the errors in which the functional outputs of the two duplicate sequential circuits differ.

It can readily be seen that, instead of a parity code, it is also possible to use another code, for example a Berger code or a Hamming code, which have a higher error detection than a parity code.

Figure 10B:
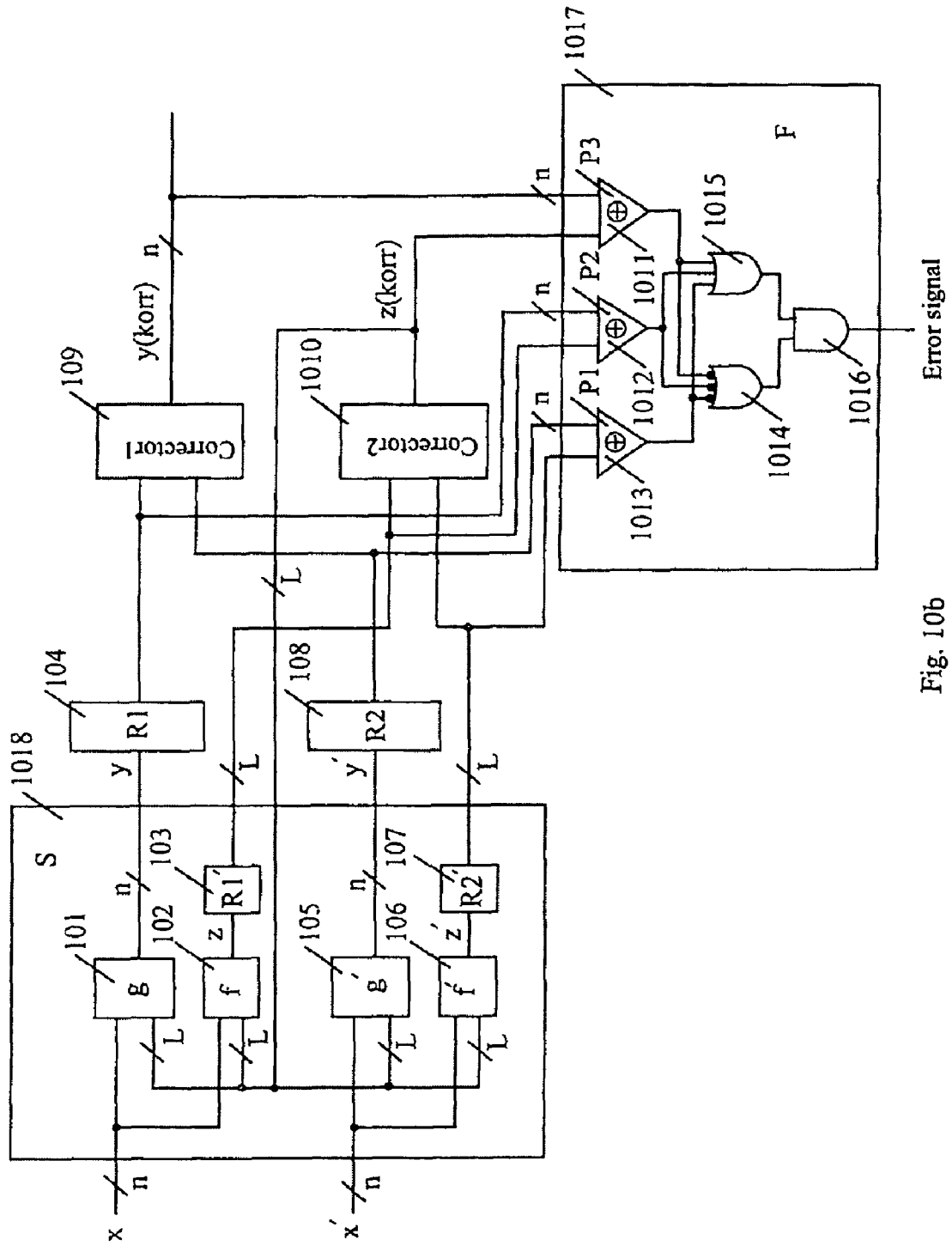

FIG. 10b is a modification of the circuit arrangement of FIG. 10a.

All the circuit parts in FIG. 10b which do not differ from the corresponding circuit parts in FIG. 10a are referenced identically and will therefore also not be described again at length here. The circuit arrangement of FIG. 10b differs from the circuit arrangement of FIG. 10a in that the L-bit-wide outputs of the registers R1' 103, R2' 107 and of the corrector Corrector2 1010, which in the circuit arrangement of FIG. 10a are not monitored by the error detection circuit, are now monitored by the error detection circuit F in the circuit arrangement of FIG. 10b.

In FIG. 10b, the input word length of the XOR trees 1011, 1012, 1013 is in each case n+L bits, while in FIG. 10a it is in each case n bits.

The L-bit-wide output of the register R1' 103, like the L-bit-wide output of the register R2' 107, is passed as in FIG. 10a to the 2 L-bit-wide input of a second corrector Corrector2 1010. Here, in each case for j=1, . . . , L, the $j^{th}$ binary output of the register R1' 103 is connected to the $(2j-1)^{th}$ input and the $j^{th}$ binary output of the register R2' 107 is connected to the $(2j)^{th}$ input of the corrector Corrector2 1010.

The L-bit-wide output of the register R1' 103 is moreover simultaneously connected to the L first inputs of the XOR tree 1012, the further n inputs of which are connected to the n-bit-wide output of the register R1 104. The L-bit-wide output of the register R2' 107 is moreover simultaneously connected to the L first inputs of the XOR tree 1013, the further n inputs of which are connected to the n-bit-wide output of the register R2 108. The L-bit-wide output of the corrector Corrector2 1010, which is simultaneously connected to the inputs of the combinatorial circuits f 102, g 101, f' 106 and g' 105, is moreover connected to the first L inputs of the XOR tree 1011, the further n inputs of which are connected to the n-bit-wide output of the corrector Corrector1 109.

The specific design of the error detection circuit can easily be varied by a person skilled in the art. For example, the L-bit-wide output of the register R2' 107 may also connected, instead of to the first L inputs of the XOR tree 1013, to the first L inputs of the XOR tree 1012 if the L-bit-wide outputs of the register R1' 103 are connected to the first L inputs of the XOR tree 1013.

Correspondingly, the respective L-bit-wide and the respective n-bit-wide connections to the XOR trees 1013, 1012 and 1011 may be swapped.

If an error occurs in the circuit parts f 102, f' 106, R1' 103, R2' 107 or in the corrector Corrector2 1010, then such an error is detected if it changes the parity of the L-bit-wide outputs of the registers R1' 103, R2' 107 or of the outputs of the corrector Corrector2 1010.

If instead of the OR gates 1014, 1015, an evaluation logic having three inputs P1, P2, P3 and two outputs u1, u2 is connected to the outputs of the three XOR trees 1013, 1014, 1015, then it can easily be determined, from the parity signals P1, P2, P3, in which part an error has occurred.

FIG. 11 shows the table of values for a possible evaluation logic.

In the table of values of FIG. 11, it can be seen in the first row and in the last row that an error-free behaviour is indicated on the output values u1=0, u2=0 if all three values of the parities P1, P2 and P3 are the same. It can be seen from the second and seventh rows of this table that an incorrect correction exists if the values of the parities P1 and P2 correspond and the value of P3 differs from these values.

The design of a combinatorial circuit which implements an evaluation logic for the evaluation logic shown in FIG. 11 as a table of values does not present any difficulty to the person skilled in the art and will therefore not be described in any greater detail here.

Figure 12:
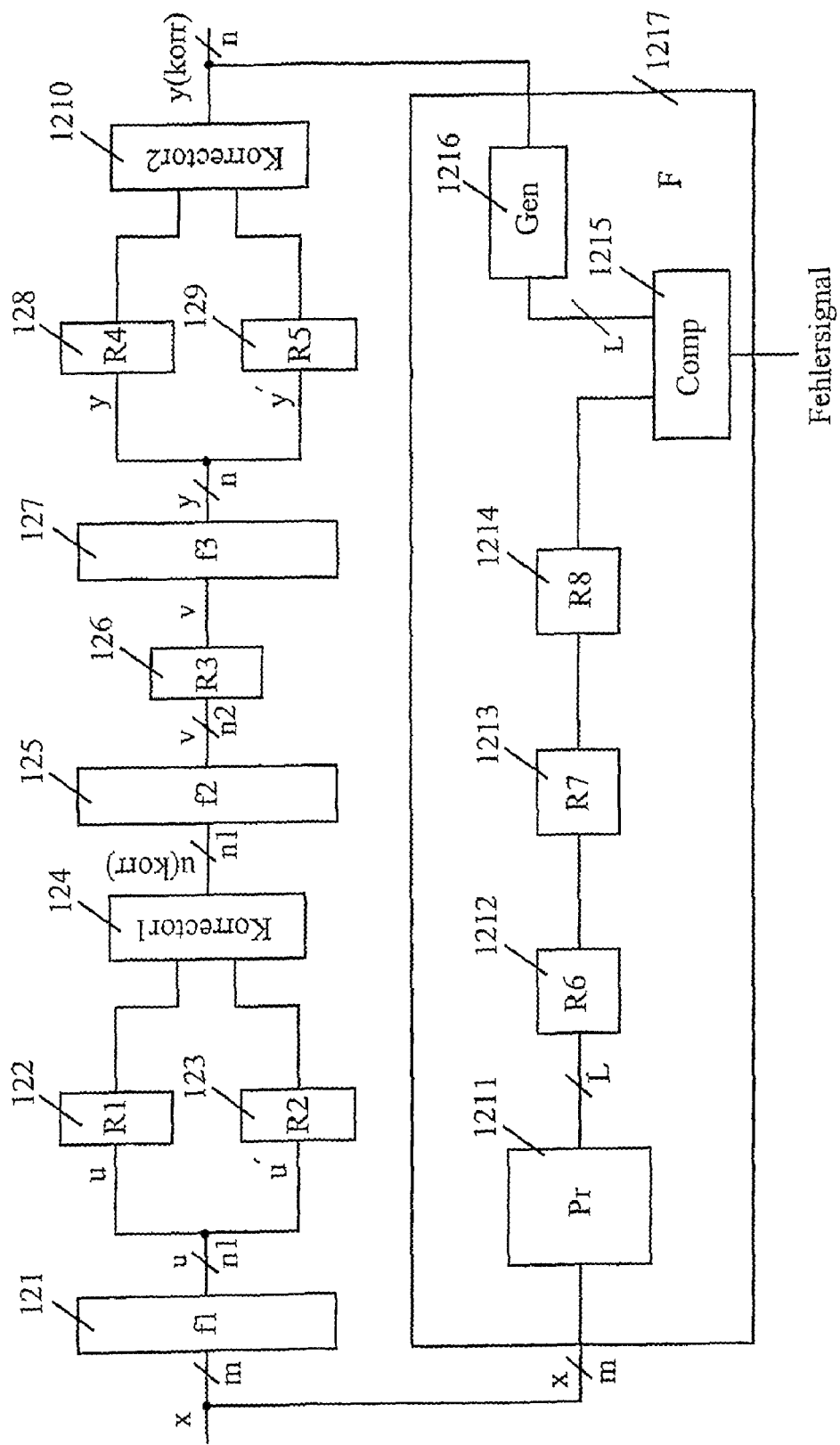
FIG. 12 shows a circuit arrangement for correction and error detection for data processing in a pipeline.

FIG. 12 shows a further circuit arrangement for error correction and error detection, wherein the n-dimensional input values are processed in successive pipeline stages.

The n-bit-wide input values x are passed to the input of a first combinatorial circuit f1 and simultaneously to a predictor Pr 1211. The output of the combinatorial circuit f1 121 which carries the n1-bit-wide values u is duplicated. The first of the duplicate outputs, which bears the value u, is passed to the n1-bit-wide input of a register R1 122, while the second of the duplicate outputs, which bears the value u', is connected to the n1-bit-wide input of the register R2 123. Here, u=u'. Both the n1-bit-wide output of the register R1 and the n1-bit-wide output of the register R2 are connected to the 2n1-bit-wide input of a corrector 1 124, the n1-bit-wide output of which is passed to the combinatorial circuit f2 125. This output carries the signal u(korr). The n2-bit-wide output of the combinatorial circuit f2 125 carries the signal v. It is connected to the input of an n2-bit-wide register R3 126, the output of which is connected to the input of a combinatorial circuit f3 127.

The n-bit-wide output of the combinatorial circuit f3 127 is duplicated in a first output, which bears the value y, and in a second output, which bears the value y'. Here, y=y'. The first output is passed to the input of an n-bit-wide register R4 128, while the second output is passed to the input of an n-bit-wide register R5 129.

Both the n-bit-wide output of the register R4 128 and the n-bit-wide output of the register R5 are connected to the 2n-bit-wide input of a corrector 2 1210, at the output of which the corrected signal y(korr) is output. The output of the corrector 1210 is also connected to the input of a generator Gen 1216.

The L-bit-wide output of the predictor 1211 is passed to the input of an L-bit-wide register R6 1212. The output of this register is connected to the input of a further register R7 1213 and the output of the latter is connected to a further register 1214, both of which have the word width L. The L-bit-wide output of the register R8 1214 is connected to the first input of a comparator Comp 1215. The output of the generator Gen 1216 is connected to the second input of the comparator Comp 1215, the output of which carries the error signal.

The error detection circuit F 1217 consists of the predictor 1211, the series-connected L-bit-wide registers R6 1212, R7 1213, R8 1214, the comparator Comp 1215 and the generator Gen 1216. For error detection, in FIG. 12 use is made of a separable code comprising n information bits and L control bits.

To describe the mode of operation of the circuit, it is assumed that the circuit in question is in functional terms a series connection of the combinatorial circuit parts f1 121, f2 125 and f3 127, the output values of which are delayed by three cycles in the registers R1 122, R2 123, R3 126, R4 128 and R5 128. Depending on its input values $x=x1, \ldots, xm$, it outputs at its n-bit-wide output the values $y1=h1(x), \ldots, yn=hn(x)$, wherein $h1, \ldots, hn$ are in each case m-ary Boolean functions and $h(x)=h1(x), \ldots, hn(x)=f3(f2(f1(x)))$.

The n information bits of the code in question are the bits $y1, \ldots, yn$. The predictor Pr 1211 then determines, as a function of the input values x, the L-control bits $c1(x), \ldots, cL(x)$, which are buffer-stored in the registers R6 1212, R7 1213, R8 1214.

The generator Gen 1216 determines from the corrected output values of the corrector 54 $y(korr)=y(korr)1, \ldots, y(korr)n$ of the information bits of the code in question, as a function of these output values, also the control bits $c1(y(korr)), \ldots, cL(y(korr))$. $c1(x), \ldots, cL(x)$ and $c1(y(korr)), \ldots, cL(y(korr))$ are checked in the comparator 1215 to check that they are the same. A difference indicates an error. As the particular code, use may be made for example of a parity code, a Berger code or a Hamming code.

In FIG. 12, the output values of the combinatorial circuits f1 121 are duplicated and are stored as u and u' in the duplicate registers R1 122 and R2 122. Soft errors in these registers are corrected by the corrector Corrector1 124 to form the output values u(korr). The output values of the combinatorial circuits f3 127 are also duplicated and are stored as y and y' in the duplicate registers R4 128 and R5 129. Soft errors in these registers are corrected by the corrector Corrector2 1210 to form the output values y(korr).

The output values of the combinatorial circuit f2 125 are not duplicated, and the values stored just once in the register R3 126 cannot be corrected even when soft errors occur.

It can be seen that it is possible in pipeline processing to duplicate some of the registers, which contain for example particularly important data, and to correct soft errors in these registers, while other registers are not duplicated for reasons of complexity. Depending on the selected code, all the circuit parts of the circuit arrangement of FIG. 12 are included in the error detection. Since different codes having different error detection properties and a different complexity can be used, the complexity of error detection can be varied.

The features of the invention which are disclosed in the above description, the claims and the drawing may be important both individually and in any combination for implementing the invention in its various embodiments.

The invention claimed is:

1. A circuit arrangement implemented in hardware, comprising:
   a functional circuit implemented in hardware with m data inputs and n data outputs for processing at least one m-dimensional binary data input to form an n-dimensional data output, wherein the functional circuit comprises at least one combinatorial circuit part;
   at least two registers implemented in hardware with a word length k which are coupled to at least some of the n data outputs of the functional circuit in order to store output values which are duplicated with respect to one another or are duplicated with bit-by-bit inversion with respect to one another, said output values being derived from the n-dimensional data output of the functional circuit;

at least one corrector implemented in hardware with an input word length 2k and an output word length k, which is coupled to data outputs of the at least two registers and supplies a k-dimensional corrected data output (y[k] (korr)=y1(korr), ..., yk(korr)); and an error detection circuit implemented in hardware for detecting errors during operation of at least one of the aforementioned circuit elements: the functional circuit, the at least two registers and the corrector;

wherein the following features are configured for the case where k=n:

the functional circuit is a combinatorial circuit with an m-bit-wide data input and an n-bit-wide data output for forming the n-dimensional data output, and a duplicating circuit part is provided for producing from the n-dimensional data output two respectively n-bit-wide duplicate data outputs, wherein a first duplicate data output of the duplicating circuit part is passed to an n-dimensional data input of a first register and a second duplicate data output of the duplicating circuit part is passed to an n-bit-wide data input of a second register, and wherein an n-bit-wide data output of the first register and an n-bit-wide data output of the second register are passed in a positionally correct manner to a 2n-bit-wide data input of the corrector, which supplies an n-dimensional corrected data output;

wherein the error detection circuit comprises a predictor, an L-bit-wide further register, a comparator and a generator, wherein L is the number of control positions of a code which is used, and in that at least one circuit configuration is formed from the following group of circuit configuration elements:

the m-dimensional binary data input is passed to a data input of the predictor, an L-bit-wide data output of the predictor is connected to an L-bit-wide data input of the further register, an L-bit-wide data output of the further register is passed to a first L-bit-wide data input of the comparator, a data output of the generator is passed to a second L-bit-wide data input of the comparator, and a data input of the generator is connected to the n-dimensional corrected data output of the corrector.

2. The circuit arrangement according to claim 1, characterized in that the corrector is formed using at least one C-element.

3. The circuit arrangement according to claim 1, characterized in that the error detection circuit is configured to include at least one component of the k-dimensional corrected data output in the error detection during operation.

4. The circuit arrangement according to claim 1, characterized in that, for i=1, ..., k, an $i^{th}$ data output of one of the at least two registers is passed to a $(2i-1)^{th}$ data input of the corrector and an $i^{th}$ data output of another of the at least two registers is passed to a $2i^{th}$ data input of the corrector.

5. The circuit arrangement according to claim 1, characterized in that the corrector is formed using a parallel connection of k C-elements.

6. The circuit arrangement according to claim 5, characterized in that, in the case of the parallel connection of the k C-elements, a $1^{st}$ and a $2^{nd}$ data input, ..., a $(2k-1)^{th}$ and a $(2k)^{th}$ data input of the corrector are connected to the respective two data inputs of the k C-elements and a data output of a $j^{th}$ C-element (Cj 2j; j=1, ..., k) is a $j^{th}$ data output of the corrector.

7. The circuit arrangement according to claim 1, characterized in that the error detection circuit is designed so as to form during operation an error signal which is dependent on one or more of the following information items suitable for evaluation: the m-dimensional binary data input, data values on internal circuit lines of the functional circuit, the data content of the at least two registers and the k-dimensional corrected data output.

8. The circuit arrangement according to claim 1, characterized in that at least one circuit configuration is formed from the following group of circuit configuration elements:

the predictor is configured to determine L control bits of an error-detecting code comprising m information bits and L control bits from the m-dimensional binary data input, the generator is configured to form L further control bits of the error-detecting code from the k-dimensional corrected data output output from the corrector, and the comparator is configured to compare the L control bits with the L further control bits and to indicate an error if the L control bits and the L further control bits do not correspond bit-by-bit.

9. The circuit arrangement according to claim 1, characterized in that, for L=1, the predictor is configured to generate a control bit designed as a parity bit, and the generator is an XOR tree with n binary data inputs, to which the k-dimensional corrected data output is applied.

10. The circuit arrangement according to claim 9, characterized in that the comparator is formed of an output line of the further register, a data input of the latter being connected to a data output of the predictor, and of an output line of the XOR tree.

11. The circuit arrangement according to claim 10, characterized in that the output lines which form the comparator, namely the output line of the further register and the output line of the XOR tree, are linked by means of an XOR gate or an XNOR gate to form a data output which carries a binary error signal.

12. The circuit arrangement according to claim 1, characterized in that the functional circuit is formed of a first combinatorial circuit and of a second combinatorial circuit which is functionally equivalent to the first combinatorial circuit.

13. The circuit arrangement according to claim 1, characterized in that the functional circuit is formed of two duplicate functionally equivalent circuits, wherein:

a first circuit comprises two combinatorial circuit parts and a register for storing an internal state, a second circuit comprises two further combinatorial circuit parts and a further register for storing a further internal state, one of the two combinatorial circuit parts is functionally equivalent to one of the further two circuit parts, and another of the two combinatorial circuit parts is functionally equivalent to another of the further two circuit parts.

14. The circuit arrangement according to claim 13, characterized in that at least one circuit configuration is formed from the following group of circuit configuration elements:

lines which carry the m-dimensional binary data input (x, x', where x=x') are passed to a respective primary data input of the two combinatorial circuit parts and of the two further combinatorial circuit parts;

an L-bit-wide data output of the other of the two combinatorial circuit parts, which carries a value of the internal state, is passed to an L-bit-wide data input of the register for storing the internal state of the first of the duplicate circuits, while an L-bit-wide data output of one of the two combinatorial circuit parts, which carries a value of the further internal state of the second of the duplicate circuits, is passed to an L-bit-wide data input of the further register for storing the further internal state;

a k-bit-wide data output of one of the two combinatorial circuit parts is passed to a k-bit-wide data input of one of the at least two registers, wherein a k-bit-wide data output of one of the at least two registers is connected in a positionally correct manner to k data inputs of a first corrector with 2k data inputs and k data outputs, while a k-bit-wide data output of the other of the two combinatorial circuit parts is passed to the k-bit-wide data input of the other of the at least two registers, wherein a k-bit-wide data output of the other of the at least two registers is connected in a positionally correct manner to the remaining k data inputs of the first corrector, at the k-bit-wide data output of which the k-dimensional corrected data output is output; and an L-bit-wide data output of the register for storing the internal state is passed in a positionally correct manner to L data inputs of a second corrector with 2L data inputs and L data outputs, while an L-bit-wide data output of the further register for storing the further internal state is connected in a positionally correct manner to the remaining L data inputs of the second corrector, wherein an L-bit-wide data output of the second corrector, which carries a corrected signal, is connected simultaneously to respective second data inputs of the two combinatorial circuit parts and of the two further combinatorial circuit parts.

15. The circuit arrangement according to claim 14, characterized in that the error detection circuit is configured to include in the error detection at least one data output of the register, which carries the value of the internal state, and at least one data output of the further register, which carries the value of the further internal state.

16. The circuit arrangement according to claim 14, characterized in that the error detection circuit is configured to include in the error detection at least one data output of the second corrector.

17. The circuit arrangement according to claim 13, characterized in that at least one of the outputs of the register for storing the internal state, of the further register for storing the further internal state or of the second corrector is included in the error detection in such a way that at least one output of the further register is connected to a further input of the predictor, at least one output of the register is connected to a further input of the predictor or at least one output of the second corrector is connected to a further input of the predictor.

18. The circuit arrangement according to claim 1, characterized in that the following circuit configuration elements are also formed:
  a data output of one of the at least two registers is connected simultaneously to a first data input of a first comparator and to a first data input of a third comparator,
  a data output of one of the at least two registers is connected simultaneously to a second data input of the first comparator and to a first data input of a second comparator,
  a data output of the corrector, which carries a corrected output value y(korr), is simultaneously connected to a second data input of the second comparator and to a second data input of the third comparator, and
  the first, the second and the third comparator are configured to output an error signal at a respective data output if data inputs do not correspond.

19. The circuit arrangement according to claim 18, characterized in that a respective data output of the first comparator of the second comparator and of the third comparator is connected to data inputs of an evaluation logic, wherein the evaluation logic is configured to determine a defective circuit element.

20. The circuit arrangement according to claim 1, characterized in that the following circuit configuration elements are also formed:
  a data output of the other of the at least two registers is connected to data inputs of a first generator for generating control bits of an error-detecting code, wherein the first generator is configured to output, at a data output, control bits of input values of the first generator,
  a data output of one of the at least two registers is connected to data inputs of a second generator for generating control bits of the error-detecting code, wherein the second generator is configured to output, at a data output, control bits of input values of the second generator, and
  a data output of the corrector, which carries a corrected output value y(korr), is connected to a data input of a third generator for generating control bits of the error-detecting code, wherein the third generator is configured to output, at a data output, control bits of input values of the third generator.

21. The circuit arrangement according to claim 20, characterized in that the error-detecting code is a parity code, and in that the first generator the second generator and the third generator for generating control bits are designed as an XOR tree for generating parity bits of the parity code.

22. The circuit arrangement according to claim 21, characterized in that the following circuit configuration elements are also formed:
  a data output of a first XOR tree is passed simultaneously to a first data input of an OR gate and, inverted, to a first data input of a further OR gate,
  a data output of a second XOR tree is passed to a second data input of the OR gate and, inverted, to a second data input of the further OR gate,
  a data output of a third XOR tree is passed to a third data input of the OR gate and, inverted, to a third data input of the further OR gate, and
  a data output of the OR gate is passed to a first data input of an AND gate and a data output of the further OR gate is passed to a second data input of the AND gate, wherein a data output of the AND gate carries an error signal.

23. The circuit arrangement according to claim 20, characterized in that data outputs of the first generator, of the second generator and of the third generator are connected to data inputs of an evaluation logic, wherein the evaluation logic is configured to determine a defective circuit element.

24. The circuit arrangement according to claim 1, characterized in that the functional circuit comprises a plurality of combinatorial circuit parts and is configured to carry out a pipeline processing of the m-dimensional binary data input to form the n-dimensional data output, wherein outputs of at least one of the plurality of combinatorial circuit parts are passed to duplicate registers and the at least one corrector is coupled to the data outputs of the duplicate registers.

25. The circuit arrangement according to claim 24, characterized in that the error detection circuit is formed as a common error detection circuit for at least two pipeline stages.

* * * * *